(12) United States Patent
Lee et al.

(10) Patent No.: US 10,714,579 B2
(45) Date of Patent: Jul. 14, 2020

(54) SEMICONDUCTOR DEVICES INCLUDING RECESSED SOURCE/DRAIN SILICIDES AND METHODS OF FORMING THE SAME

(71) Applicant: Samsung Electronics Co., Ltd., Suwon-si (KR)

(72) Inventors: Heon Bok Lee, Suwon-si (KR); Chul Sung Kim, Seongnam-si (KR); Sang Jin Hyun, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 40 days.

(21) Appl. No.: 15/999,191

(22) Filed: Aug. 20, 2018

(65) Prior Publication Data

US 2019/0074362 A1 Mar. 7, 2019

(30) Foreign Application Priority Data

Sep. 1, 2017 (KR) ......................... 10-2017-0111745

(51) Int. Cl.
*H01L 29/417* (2006.01)
*H01L 29/08* (2006.01)
(Continued)

(52) U.S. Cl.
CPC ........ *H01L 29/41791* (2013.01); *B82Y 10/00* (2013.01); *H01L 21/28518* (2013.01); *H01L 21/76805* (2013.01); *H01L 21/76831* (2013.01); *H01L 29/0673* (2013.01); *H01L 29/0847* (2013.01); *H01L 29/4175* (2013.01); *H01L 29/41725* (2013.01); *H01L 29/41766* (2013.01); *H01L 29/42392* (2013.01); *H01L 29/456* (2013.01); *H01L 29/6653* (2013.01); *H01L 29/6681* (2013.01); *H01L 29/66439* (2013.01); *H01L 29/66545* (2013.01); *H01L 29/66553* (2013.01); *H01L 29/775* (2013.01); *H01L 29/7853* (2013.01); *H01L 29/78696* (2013.01);
(Continued)

(58) Field of Classification Search
CPC ................................................ H01L 29/41791
USPC .................................................... 257/384
See application file for complete search history.

(56) References Cited

U.S. PATENT DOCUMENTS 6,441,418 B1 8/2002 Shields et al.
7,670,912 B2 3/2010 Yeo et al.
(Continued)

FOREIGN PATENT DOCUMENTS

WO WO 2017/111850 A1 6/2017

OTHER PUBLICATIONS

Invitation to Respond to Written Opinion, Singapore Application No. 10201804486S, dated Oct. 18, 2018, 9 pages.

*Primary Examiner* — Jami Valentine Miller
(74) *Attorney, Agent, or Firm* — Muir Patent Law, PLLC

(57) ABSTRACT

A gate all around field effect transistor (GAAFET) device may include a plurality of nanostructures that are spaced apart from one another in a channel region of the FET device above a substrate. A gate electrode can be in a GAA arrangement with the plurality of nanostructures and a semiconductor pattern can be on one side of the gate electrode. A contact in a contact trench in the semiconductor pattern and a silicide film can extend conformally on a side wall of the contact trench to a level in the channel region that is lower an uppermost one of the plurality of nanostructures.

18 Claims, 27 Drawing Sheets

(51) Int. Cl.

| | |
|---|---|
| *B82Y 10/00* | (2011.01) |
| *H01L 29/786* | (2006.01) |
| *H01L 29/66* | (2006.01) |
| *H01L 29/775* | (2006.01) |
| *H01L 21/285* | (2006.01) |
| *H01L 21/768* | (2006.01) |
| *H01L 29/06* | (2006.01) |
| *H01L 29/423* | (2006.01) |
| *H01L 29/45* | (2006.01) |
| *H01L 29/78* | (2006.01) |
| *H01L 29/10* | (2006.01) |

(52) U.S. Cl.
CPC ........ *H01L 29/1054* (2013.01); *H01L 29/665* (2013.01)

(56) References Cited

U.S. PATENT DOCUMENTS

| | | |
|---|---|---|
| 8,309,950 B2 | 11/2012 | Iwayama et al. |
| 9,508,858 B2 | 11/2016 | Diaz et al. |
| 9,590,038 B1 | 3/2017 | Kim et al. |
| 9,653,462 B2 | 5/2017 | Suk et al. |
| 2015/0333162 A1 | 11/2015 | Bouche et al. |
| 2016/0233164 A1 | 8/2016 | Choi et al. |
| 2016/0365440 A1 | 12/2016 | Suk et al. |
| 2017/0103948 A1 | 4/2017 | Lee et al. |
| 2017/0154958 A1 | 6/2017 | Fung et al. |
| 2017/0154973 A1 | 6/2017 | Ching et al. |
| 2017/0250261 A1 | 8/2017 | Kim et al. |
| 2019/0164765 A1* | 5/2019 | Yeoh ................. H01L 21/31105 |
| 2019/0164841 A1* | 5/2019 | St. Amour ........ H01L 29/41791 |
| 2019/0164846 A1* | 5/2019 | Leib ................ H01L 21/823814 |

* cited by examiner

SEMICONDUCTOR DEVICES INCLUDING RECESSED SOURCE/DRAIN SILICIDES AND METHODS OF FORMING THE SAME

CROSS-REFERENCE TO RELATED APPLICATION

This application claims priority from Korean Patent Application No. 10-2017-0111745 filed on Sep. 1, 2017 in the Korean Intellectual Property Office, the disclosure of which is incorporated herein by reference in its entirety.

BACKGROUND

The present inventive concept relates to a semiconductor device. More particularly, the present inventive concept relates to a semiconductor device having a gate all-around structure.

A gate all-around structure can include a nanowire-shaped silicon on a substrate and a gate that is formed to wrap-around the silicon body.

Since such a gate all-around structure uses three-dimensional channels, scaling may be less difficult. Further, the current control capability can be improved without increasing the length of the gate. Additionally, it is possible to effectively suppress a short channel effect (SCE) in which potential of a channel region is affected by drain voltage.

SUMMARY

Embodiments according to the present inventive concept can provide a semiconductor device including recessed source/drain silicides which may enable a reduction in a contact resistance between the source/drain and a contact thereon.

Embodiments according to the present inventive concept can provide methods of forming of forming recessed source/drain silicides which may enable a reduction in a contact resistance between the source/drain and a contact thereon.

Pursuant to these embodiments, a gate all around field effect transistor (GAAFET) device may include a plurality of nanostructures that are spaced apart from one another in a channel region of the FET device above a substrate. A gate electrode can be in a GAA arrangement with the plurality of nanostructures and a semiconductor pattern can be on one side of the gate electrode. A contact in a contact trench in the semiconductor pattern and a silicide film can extend conformally on a side wall of the contact trench to a level in the channel region that is lower an uppermost one of the plurality of nanostructures.

In some embodiments, a semiconductor device can include first, second, and third wire patterns that are spaced apart from one another in numerical order in a channel region of the semiconductor device above a substrate. A gate electrode can be wrapped around the first, second, and third wire patterns. A semiconductor pattern can be disposed on one side of the gate electrode over the substrate and an interlayer insulating film can be on the semiconductor pattern. A contact can be in the interlayer insulating film and embedded in the semiconductor pattern. A silicide film can extend along a profile of the contact between the contact and the semiconductor pattern, where the first wire pattern can include a lowermost wire pattern in the channel region and a lowermost part of the silicide film can be located between an uppermost part of the first wire pattern and a lowermost part of the second wire pattern.

In some embodiments, a semiconductor device can include first, second, and third wire patterns spaced apart from one another in numerical order in a channel region of the semiconductor device above a substrate. A gate spacer can define a gate trench in the substrate and a gate electrode can wrap around the first, second, and third wire patterns in the gate trench. A semiconductor pattern can be on one side of the gate electrode on the substrate. An interlayer insulating film can wrap around a sidewall of the gate spacer on the semiconductor pattern. A contact can be in the semiconductor pattern and in the interlayer insulating film, where the contact can include a first portion and a second portion on the first portion. A silicide film can be between the contact and the semiconductor pattern, where a width of the first portion of the contact away from a boundary between the first portion of the contact and the second portion of the contact can be less than a width of the second portion of the contact, at the boundary. The first wire pattern can include a lowermost wire pattern in the channel region and a lowermost part of the silicide film is located between an uppermost part of the first wire pattern and a lowermost part of the second wire pattern.

In some embodiments, a semiconductor device can include first, second, and third wire patterns spaced apart from one another in numerical order in a channel region of the semiconductor device above a substrate. A gate spacer can define a gate trench in the substrate and a gate electrode can wrap around the first, second, and third wire patterns in the gate trench. A semiconductor pattern can be on one side of the gate electrode on the substrate and an interlayer insulating film can wrap around a sidewall of the gate spacer on the semiconductor pattern. A contact can include a barrier conductive film and a filling conductive film on the barrier conductive film, in the semiconductor pattern and in the interlayer insulating film, where the contact includes a first portion, and a second portion on the first portion. A width of the first portion of the contact away from a boundary between the first portion of the contact and the second portion of the contact may be less than a width of the second portion of the contact, at the boundary and the filling conductive film can be absent from the first portion of the contact.

In some embodiments, a method of forming a semiconductor device can be provided by forming a semiconductor pattern on a substrate and forming first, second, and third wire patterns connected to the semiconductor pattern in numerical order on the substrate in a channel region of the semiconductor device. A gate electrode can be formed to wrap the first to third wire patterns. An interlayer insulating film can be formed on the gate electrode and a contact trench can be formed in the interlayer insulating film and in the semiconductor pattern, the contact trench can include a first portion and a second portion on the first portion, where a width of the first portion of the contact trench away from a boundary between the first portion and the second portion of the contact trench can be less than a width of the second portion of the contact trench at the boundary. A silicide film can be formed along part of the contact trench. A contact can be formed on the silicide film, to fill the contact trench, where the first wire pattern can include a lowermost wire pattern in the channel region and a lowermost part of the silicide film can be located between an uppermost part of the first wire pattern and a lowermost part of the second wire pattern.

BRIEF DESCRIPTION OF THE DRAWINGS

The above and other aspects and features of the present inventive concept will become more apparent by describing in detail exemplary embodiments thereof with reference to the attached drawings, in which:

FIG. 1 is a diagram for explaining the semiconductor device according to some embodiments of the present inventive concept;

FIG. 12b is a cross-sectional view taken along line C-C' of FIG. 12a;

DETAILED DESCRIPTION OF EMBODIMENTS

Figure 1:
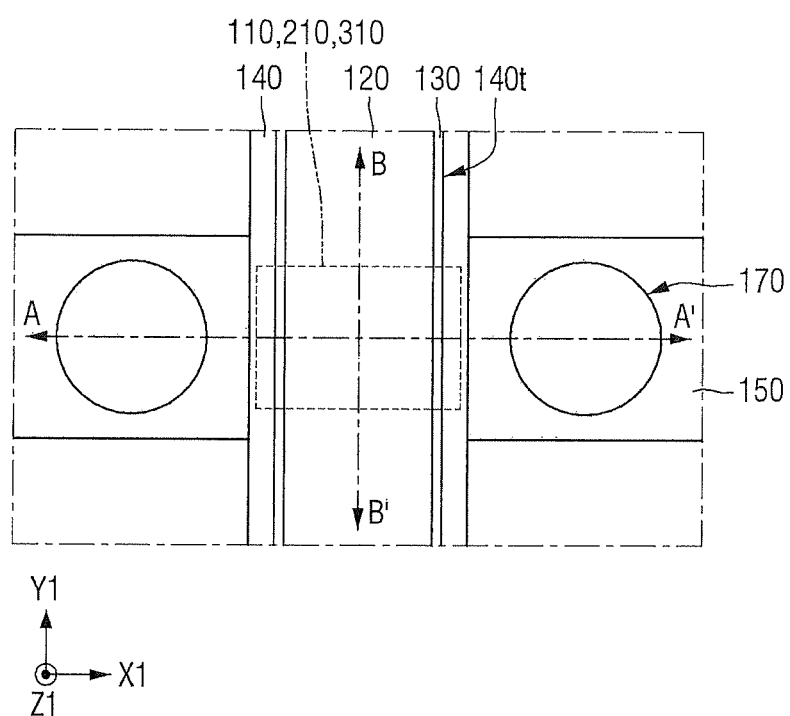
FIG. 1 is a plan view for explaining a semiconductor device according to some embodiments of the present inventive concept.

In the drawings of the semiconductor device according to some embodiments of the present inventive concept, a gate all-around transistor (GAA FET) including a nanowire-shaped or a nanosheet-shaped channel region is illustrated as an example, but the present disclosure is not limited thereto. It will be understood that the term "nanosheet," "nanosheet-shaped" can include a two-dimensional nanostructure with thickness in a scale ranging from 1 to 100 nm. Nanosheets are also described in, for example, U.S. Pat. No. 9,490,323, entitled "Nanosheet FETs with stacked nanosheets having smaller horizontal spacing than vertical spacing for large effective width," which is commonly assigned to the present assignee and the disclosure of which is incorporated herein by reference in its entirety. It will be further understood that the term "nanostructure" can include a semiconductor pattern based nanosheet or nanowire included in a GAA FET device. It will be further understood that the terms first, second, third etc. indicate a numerical sequence wherein lesser numbers precede greater numbers in the sequence. However, in some embodiments, other structures in a numerical sequence may be intervening in the sequence. For example, in a sequence of first to third structures, other structures may be inserted in the sequence without changing the numerical relationship between the first to third structures.

The semiconductor device according to some embodiments of the present inventive concept may include a tunneling transistor (FET), a bipolar junction transistor, a lateral double diffused transistor (LDMOS) or the like.

Figure 2:
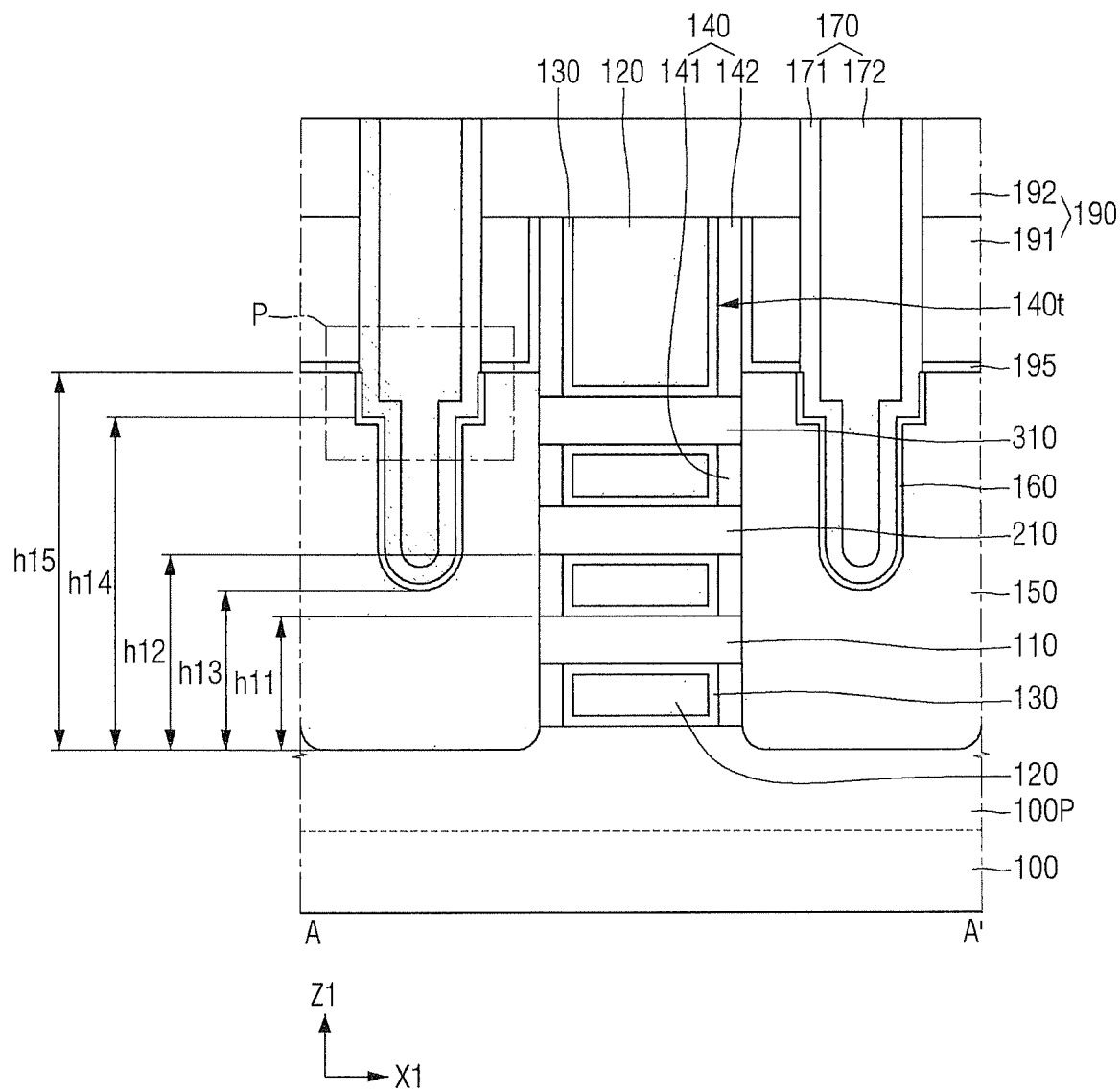
FIG. 2 is a cross-sectional view taken along line A-A' of FIG. 1.
Figure 3:
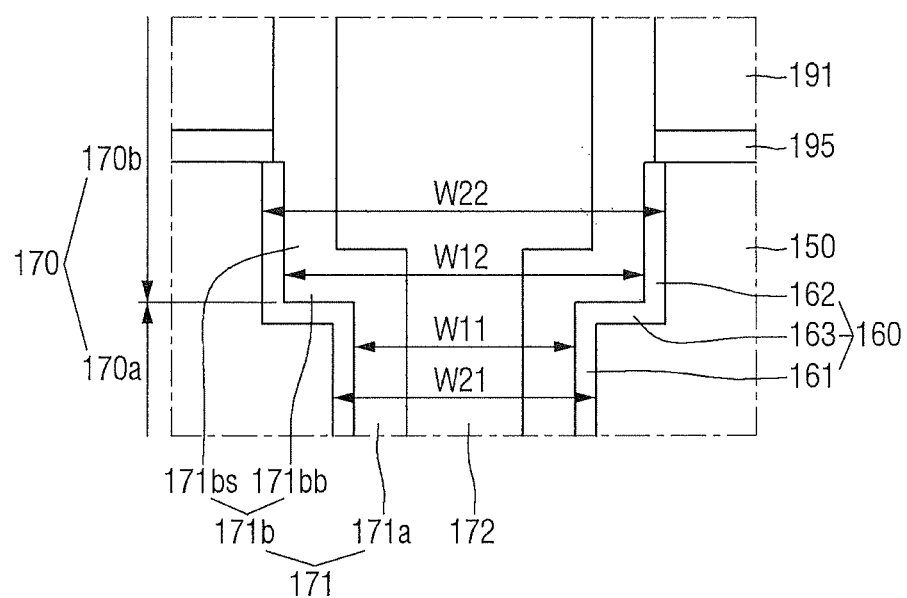
FIG. 3 is an enlarged view of a part P of FIG. 2.
Figure 4:
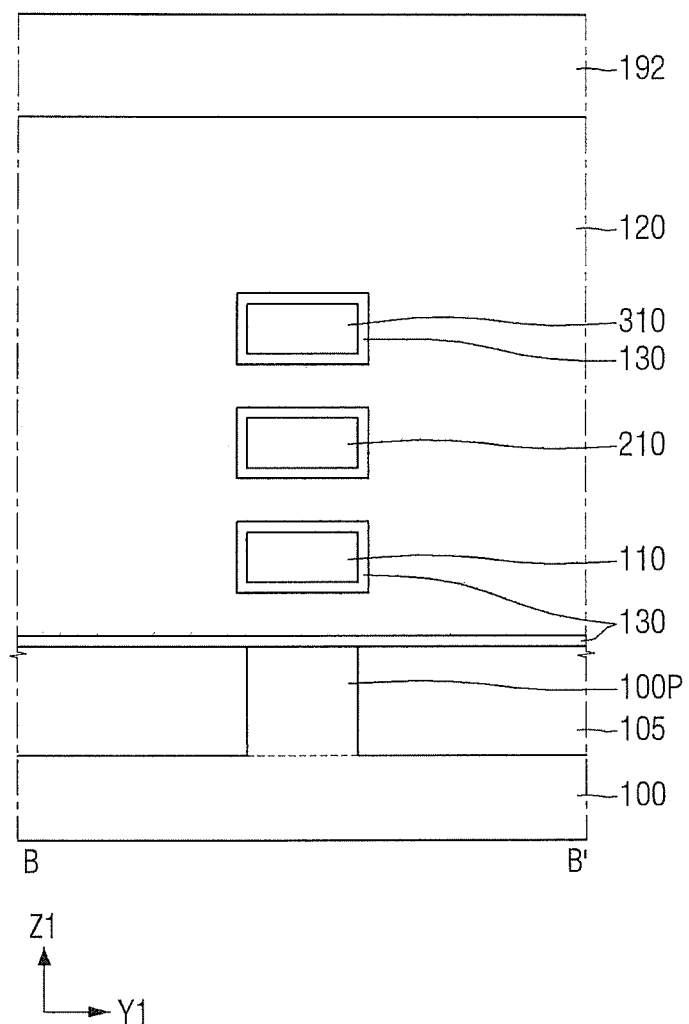
FIG. 4 is a cross-sectional view taken along line B-B' of FIG. 1.

FIG. 1 is a plan view for explaining a semiconductor device according to some embodiments of the present inventive concept. FIG. 2 is a cross-sectional view taken along line A-A' of FIG. 1. FIG. 3 is an enlarged view of a part P of FIG. 2. FIG. 4 is a cross-sectional view taken along line B-B' of FIG. 1. FIGS. 5a to 5e are various cross-sectional views of a first wire pattern of FIG. 1 taken along line B-B'. For the sake of convenience of explanation, an interlayer insulating film 190 is not illustrated in FIG. 1.

Referring to FIGS. 1 to 4, a semiconductor device according to some embodiments of the present inventive concept may include a substrate 100, a plurality of wire patterns 110, 210, and 310, a gate electrode 120, a semiconductor pattern 150, a silicide film 160, and a contact 170.

The substrate 100 may be a bulk silicon or a silicon-on-insulator (SOI). Alternatively, the substrate 100 may be a silicon substrate or may include other materials, for example, silicon germanium, silicon germanium on insulator (SGOI), indium antimonide, lead tellurium compound, indium arsenide, indium phosphide, gallium arsenide or gallium antimonide, but the present disclosure is not limited thereto.

A fin-like protrusion 100P (sometimes referred to herein as a fin-shaped protrusion) may protrude from the substrate 100. The fin-like protrusion 100P may extend long in a first direction X1. The fin-like protrusion 100P may be formed by etching a part of the substrate 100, and may include an epitaxial layer that is grown from the substrate 100.

The fin-like protrusion 100P may include silicon or germanium which is an elemental semiconductor material. Further, the fin-like protrusion 100P may include a compound semiconductor, and may include, for example, a group IV-IV compound semiconductor or a group III-V compound semiconductor.

The group IV-IV compound semiconductor may be, for example, a binary compound or a ternary compound including at least two or more of carbon (C), silicon (Si), germanium (Ge), and tin (Sn), or a compound obtained by doping these elements with group IV elements. For example, the group III-V compound semiconductor may be a binary compound, a ternary compound, or a quaternary compound formed by combining at least one of aluminum (Al), gallium (Ga) and indium (In) as a group III element and at least one of phosphorus (P), arsenic (As) and antimonium (Sb) as a group V element.

The field insulating film 105 may be formed on the substrate 100. The field insulating film 105 may wrap at least a part of the sidewall of the fin-like protrusion 100P. The fin-like protrusion 100P may be defined by the field insulating film 105. In FIG. 4, the sidewalls of the fin-like protrusion 100P are illustrated as being entirely wrapped by the field insulating film 105, but this is for the sake of convenience of explanation, and the present disclosure is not limited thereto.

The field insulating film 105 may include, for example, one of an oxide film, a nitride film, an oxynitride film, or a combination thereof. Further, the field insulating film 105 may further include at least one or more field liner films formed between the fin-like protrusion 100P and the field insulating film 105. When the field insulating film 105 further includes the field liner film, the field liner film may include at least one of polysilicon, amorphous silicon, silicon oxynitride, silicon nitride, and silicon oxide.

Three or more wire patterns may be formed on the substrate 100 in numerical order starting from the surface of the substrate and progressing toward the gate electrode 120. For example, the first wire pattern 110 may be the lowermost wire pattern that is located closest to the surface of the substrate in the channel region of the semiconductor device. In the following description, although the number of wire patterns formed on the substrate 100 is illustrated as three, this is for the sake of convenience of explanation, and the present disclosure is not limited thereto.

The first to third wire patterns 110, 210, and 310 may be sequentially formed on the substrate 100. For example, the first to third wire patterns 110, 210, and 310 may be sequentially disposed on the fin-like protrusion 100 P.

The first to third wire patterns 110, 210, and 310 may be formed to extend in the first direction X1, as in the fin-like protrusion 100P. The first to third wire patterns 110, 210, and 310 may be sequentially arranged in a third direction Z1.

The first wire pattern 110 may be formed to be spaced apart from the substrate 100. For example, the first wire pattern 110 may be formed to be spaced apart from the fin-like protrusion 100P. The first wire pattern 110 may vertically overlap the fin-like protrusion 100P. The first wire pattern 110 may not be formed on the field insulating film 105 but may be formed on the fin-like protrusion 100P.

The second wire pattern 210 may be formed to be spaced apart from the first wire pattern 110. The third wire pattern 310 may be formed to be spaced apart from the second wire pattern 210. Since the first wire pattern 110 is formed to be spaced apart from the substrate 100 and the fin-like protrusion 100P, the second wire pattern 210 and the third wire pattern 310 may also be formed to be spaced apart from the fin-like protrusion 100P.

A wire pattern extending in the first direction X1 may not be further formed between the first wire pattern 110 and the fin-like protrusion 100P. That is, the first wire pattern 110 may be a wire pattern closest to the substrate 100 among a plurality of wire patterns sequentially disposed on the substrate 100.

Each of the first to third wire patterns 110, 210, and 310 may include silicon or germanium which is an elemental semiconductor material. In addition, each of the first to third wire patterns 110, 210, and 310 may include compound semiconductors, and may include, for example, a group IV-IV compound semiconductor or a group III-V compound semiconductor.

Each of the first to third wire patterns 110, 210, and 310 may be used as a channel region of a transistor. Each of the first to third wire patterns 110, 210, and 310 may contain the same material or may contain other materials. Each of the first to third wire patterns 110, 210, and 310 may include the same material as the fin-like protrusion 100P, and may include a material different from the fin-like protrusion 100P.

A gate spacer 140 may extend in a second direction Y1. The gate spacer 140 may intersect with the first to third wire patterns 110, 210, and 310.

The gate spacer 140 may be located at both terminal ends of each of the first to third wire patterns 110, 210, and 310 extending in the first direction X1. The gate spacer 140 may be formed to face each other on both sides of the first to third wire patterns 110, 210, and 310. The gate spacer 140 may include a penetration portion through which each of the first to third wire patterns 110, 210, and 310 penetrates.

Each of the first to third wire patterns 110, 210, and 310 may pass through the gate spacer 140. The gate spacer 140 may make overall contact with the circumferences of the terminal ends of each of the first to third wire patterns 110, 210, and 310.

The gate spacer 140 may include an inner spacer 141 and an outer spacer 142. The inner spacer 141 may be disposed between the fin-like protrusion 100P and the first wire pattern 110, between the first wire pattern 110 and the second wire pattern 210, and between the second wire pattern 210 and the third wire pattern 310.

The inner spacer 141 may be formed at a position which vertically overlaps the first to third wire patterns 110, 210, and 310. The inner spacer 141 may not be formed on the field insulation film 105 which does not overlap the first to third wire patterns 110, 210, and 310. That is, the outer spacer 142 may be formed on the upper surface of the field insulating film 105. The outer spacer 142 may be positioned on the third wire pattern 310.

The gate spacer 140 may define a gate trench 140t that intersects with the first to third wire patterns 110, 210, and 310.

The inner spacer 141 may include at least one of, for example, silicon nitride (SiN), silicon oxynitride (SiON), silicon oxide (SiO2), silicon oxycarbonitride (SiOCN), and combinations thereof. The outer spacer 142 may include at least one of, for example, silicon nitride (SiN), silicon oxynitride (SiON), silicon oxide (SiO2), silicon oxycarbonitride (SiOCN), and combinations thereof. In FIG. 2, the inner spacer 141 and the outer spacer 142 may be the same material or different materials.

The gate insulating film 130 may be formed along the circumferences of each of the first to third wire patterns 110, 210, and 310. The gate insulating film 130 may wrap each of the first to third wire patterns 110, 210, and 310.

The gate insulating film 130 may also be formed on the upper surface of the field insulating film 105 and on the fin-like protrusion 100P. The gate insulating film 130 may extend along the inner wall of the gate spacer 140.

The gate insulating film 130 may extend along the sidewalls and the bottom surface of the gate trench 140t and the circumferences of the first to third wire patterns 110, 210, and 310.

An interfacial layer may be formed between the gate insulating film 130 and the first wire pattern 110, between the gate insulating film 130 and the second wire pattern 210, between the gate insulating film 130 and the third wire pattern 310, and between the gate insulating film 130 and the fin-like protrusion 100P. In addition, depending on the method for forming the interfacial layer, the interfacial layer may be formed to be the same as the profile of the gate insulating film 130.

The gate insulating film 130 may include at least one of silicon oxide, silicon oxynitride, silicon nitride, or a high dielectric constant material having a dielectric constant greater than that of silicon oxide. The high dielectric constant material may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The gate electrode 120 may intersect with the first to third wire patterns 110, 210, and 310 formed to be spaced apart from the substrate 100 and the fin-like protrusion 100P. The gate electrode 120 may wrap around (i.e., all-around) the first to third wire patterns 110, 210, and 310. The gate electrode 120 may also be formed in a spaced space between the first wire pattern 110 and the fin-like protrusion 100P. A wire pattern wrapping around the gate electrode 120 may not be disposed between the substrate 100 and the first wire pattern 110.

The gate electrode 120 may be disposed between the gate spacers 140. The gate electrode 120 may be formed on the gate insulating film 130. The gate electrode 120 may fill the gate trench 140t and extend in the second direction Y1.

The gate electrode 120 may include at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. The gate electrode 120 may be formed through, but is not limited to, for example, a replacement process (or a gate last process).

The semiconductor pattern 150 may be disposed on at least one side of the gate electrode 120. For example, the semiconductor pattern 150 may be disposed on both sides of the gate electrode 120. The semiconductor pattern 150 may be an epitaxial pattern formed through an epitaxial growth process. The semiconductor pattern 150 may be connected to each of the first to third wire patterns 110, 210, and 310. The semiconductor pattern 150 may be formed on, for example, the fin-like protrusion 100P. The semiconductor pattern 150 may be included in a source/drain of the transistor which uses the first to third wire patterns 110, 210, and 310 as a channel region.

The interlayer insulating film 190 may be formed on the semiconductor pattern 150. The interlayer insulating film 190 may wrap the sidewalls of the gate spacer 140. The interlayer insulating film 190 may include a lower interlayer insulating film 191 and an upper interlayer insulating film 192. The upper interlayer insulating film 192 may be formed on the upper surface of the gate spacer 140 and the upper surface of the gate electrode 120. The lower interlayer insulating film 191 and the upper interlayer insulating film 192 may each include, for example, at least one of silicon oxide, silicon nitride, silicon oxynitride.

An etching stop film 195 may be formed, for example, between the semiconductor pattern 150 and the interlayer insulating film 190, and between the gate spacer 140 and the interlayer insulating film 190. The etching stop film 195 may include a material having an etching selectivity to the lower interlayer insulating film 191. In some embodiments, the etching stop film 195 may be omitted.

The contact 170 may be formed in the interlayer insulating film 190 and the semiconductor pattern 150. The contact 170 passes through the interlayer insulating film 190, but does not pass entirely through the semiconductor pattern 150. The contact 170 may extend in the third direction Z1. A part of the contact 170 is formed in the semiconductor pattern 150.

The contact 170 may include a barrier conductive film 171 and a filling conductive film 172. The filling conductive film 172 may be formed on the barrier conductive film 171.

The filling conductive film 172 may fill a recessed space defined by the barrier conductive film 171. Although the cross-section of the contact 170 intersecting with the X1-Y1 plane is illustrated as a circular shape in FIG. 1, this is for the sake of convenience of description, and the present disclosure is not limited thereto.

The barrier conductive film 171 may include, for example, at least one of tantalum (Ta), tantalum nitride (TaN), titanium (Ti), titanium nitride (TiN), tungsten nitride (WN), and tungsten carbonitride (WCN). The filling conductive film 172 may include, for example, at least one of tungsten (W), cobalt (Co), ruthenium (Ru), molybdenum (Mo), nickel (Ni), aluminum (Al), copper (Cu), and doped polysilicon.

The contact 170 may include a first portion 170a and a second portion 170b. The second portion 170b of the contact may be disposed on the first portion 170a of the contact.

The barrier conductive film 171 may include a first sidewall portion 171a extending in a direction away from the substrate 100, a connecting portion 171bb extending in a direction aligned with the upper surface of the substrate 100, and a second sidewall portion 171bs extending in a direction away from the substrate 100. The upper portion 171b of the barrier conductive film may include the connecting portion 171bb of the barrier conductive film, and the second sidewall portion 171bs of the barrier conductive film. A lower portion of the barrier conductive film 171 may include the first sidewall portion 171a of the barrier conductive film.

A boundary between the first portion 170a of the contact and the second portion 170b of the contact may be, for example, a boundary between the connecting portion 171bb of the barrier conductive film and the first sidewall portion 171a of the barrier conductive film. The first portion 170a of the contact may include first sidewall portions 171a of the barrier conductive film, and a filling conductive film 172 between the first sidewall portions 171a of the barrier conductive film. The second portion 170b of the contact may include the upper portion 171b of the barrier conductive film, and a filling conductive film 172 between the second sidewall portions 171bs of the barrier conductive film.

As used herein, the term "boundary," can refer to a line that demarks two different regions of one structure, material, or layer regardless of whether the boundary is created by a physical object (such as a layer, a change in material, or a change in material composition) or is a an virtual demarcation used to define at least two different regions within a unitary structure, material, or layer.

In the semiconductor device according to some embodiments of the present inventive concept, at the boundary between the first portion 170a of the contact and the second portion 170b of the contact, a width W11 of the first portion 170a of the contact is less than a width W12 of the second portion 170b of the contact.

The boundary between the first portion 170a of the contact and the second portion 170b of the contact may be lower than the upper surface of the gate spacer 140 and the upper surface of the gate electrode 120. For example, the boundary between the first portion 170a of the contact and the second portion 170b of the contact may be lower than the upper surface of the semiconductor pattern 150. A height h14 from the bottom surface of the semiconductor pattern 150 to the boundary between the first portion 170a of the contact and the second portion 170b of the contact is less than a height h15 from the bottom surface of the semiconductor pattern 150 to the upper surface of the semiconductor pattern 150.

At least a part of the first portion 170a of the contact may be disposed in the semiconductor pattern 150. For example, the first portion 170a of the contact may be disposed in the semiconductor pattern 150. The sidewall of the first portion 170a of the contact may be wrapped by the semiconductor pattern 150. A part of the second portion 170b of the contact may be disposed in the semiconductor pattern 150. The second portion 170b of the contact may be wrapped by the semiconductor pattern 150 and the interlayer insulating film 190.

A silicide film 160 may be formed between the semiconductor pattern 150 and the contact 170. The silicide film 160 may be formed along the boundary between the semiconductor pattern 150 and the contact 170. The silicide film 160 may be in contact with the semiconductor pattern 150.

The silicide film 160 may include, for example, at least one of titanium silicide (TiSi), tungsten silicide (WSi), cobalt silicide (CoSi), nickel silicide (NiSi), molybdenum silicide (MoSi), and tantalum silicide (TaSi).

The silicide film 160 may extend along the profile of the contact 170. For example, the silicide film 160 may be formed along the profile of the contact 170 recessed into the semiconductor pattern 150.

The silicide film 160 may extend along at least a part of the profile of the first portion 170a of the contact, between the first portion 170a of the contact and the semiconductor pattern 150. For example, a part of the silicide film 160 may extend along the profile of the first portion 170a of the contact. The remainder of the silicide film 160 may extend along the profile of the second portion 170b of the contact.

The silicide film 160 connects the first portion 161 and the second portion 162 extending in a direction away from the substrate 100, and a third portion 163 which connects the first portion 161 and the second portion 162 and extends in a direction aligned with the upper surface of the substrate 100. For example, the width W21 of the first portion 161 of the silicide film is greater than the width W22 of the second portion 162 of the silicide film. The first portion 161 of the silicide film extends along the first sidewall portion 171a of the barrier conductive film, and the second portion 162 of the silicide film extends along the second sidewall portion 171bs of the barrier conductive film. The third portion 163 of the silicide film extends along the connecting portion 171bb of the barrier conductive film.

For example, the height h15 from the bottom surface of the semiconductor pattern 150 to the uppermost part of the silicide film 160 may be greater than the height h14 from the bottom surface of the semiconductor pattern to the boundary between the first portion 170a of the contact and the second portion 170b of the contact.

The silicide film 160 may be spaced apart from the first to third wire patterns 110, 210, and 310 by the semiconductor pattern 150. A part of the semiconductor pattern 150 may be interposed between the first wire pattern 110 and the silicide film 160, between the second wire pattern 210 and the silicide film 160, and between the third wire pattern 310 and the silicide film 160. Since the semiconductor pattern 150 is interposed between each of the first to third wire patterns 110, 210, and 310 and the silicide film 160, an effective contact area between the contact 170 and the first to third wire patterns 110, 210, and 310 may increase.

In the semiconductor device according to some embodiments of the present inventive concept, the lowermost part of the silicide film 160 may be located between the uppermost part of the first wire pattern 110 and the lowermost part of the second wire pattern 210. For example, the height h13 from the bottom surface of the semiconductor pattern 150 to the lowermost part of the silicide film 160 is greater than the height h11 from the bottom surface of the semiconductor pattern 150 to the uppermost part of the first wire pattern 110. Further, the height h13 from the bottom surface of the semiconductor pattern 150 to the lowermost part of the silicide film 160 is less than the height h12 from the bottom surface of the semiconductor pattern 150 to the lowermost part of the second wire pattern 210.

As the depth at which the silicide film 160 and the contact 170 are formed becomes deeper, the contact area increases, and the contact resistance may decrease. On the other hand, as the depth at which the silicide film 160 and the contact 170 are formed becomes deeper, the volume of the semiconductor pattern 150 decreases. Since the volume of the semiconductor pattern 150 decreases, stress applied to the first to third wire patterns 110, 210, and 310 serving as the channel region may also decrease.

By locating the lowermost part of the silicide film 160 between the uppermost part of the first wire pattern 110 and the lowermost part of the second wire pattern 210, the contact resistance between the contact 170 and the semiconductor pattern 150 may be reduced. At the same time, by locating the lowermost part of the silicide film 160 between the uppermost part of the first wire pattern 110 and the lowermost part of the second wire pattern 210, stress relaxation due to volume reduction of the semiconductor pattern 150 may also be reduced.

In FIGS. 2 and 3, the outer wall of the second portion 170b of the contact wrapped by the interlayer insulating film 190 and the etching stop film 195 is illustrated as not being aligned with one sidewall of the silicide film 160 facing the barrier conductive film 171, but the present disclosure is not limited thereto.

The transverse section of the first wire pattern 110 will be described with reference to FIGS. 5a to 5e. The description of the first wire pattern 110 may be applied to the second and third wire patterns 210 and 310.

Figure 5A:
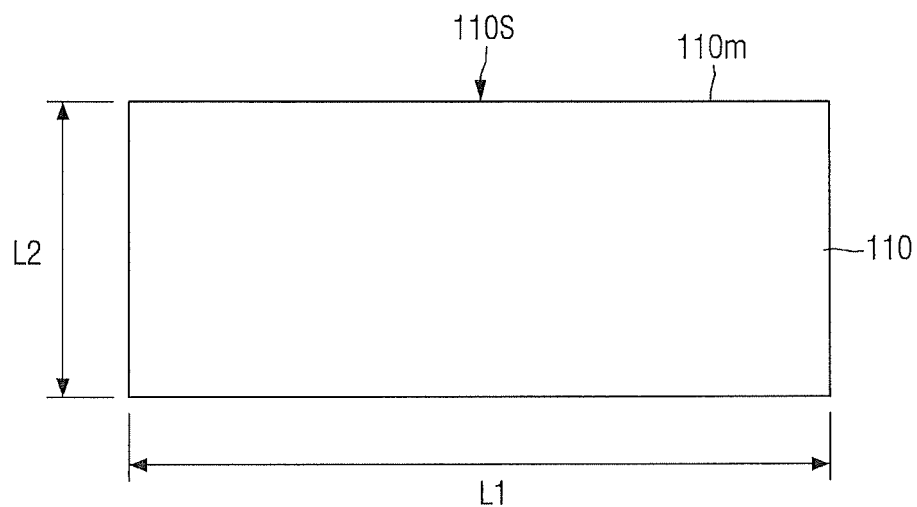
FIGS. 5a to 5e are various cross-sectional views of a first wire pattern of FIG. 1 taken along line B-B'.

In FIG. 5a, a transverse section 110S of the first wire pattern 110 may be a figure including a combination of straight lines 110m. The transverse section 110S of the first wire pattern 110 may be, for example, a rectangle. The width L1 of the first wire pattern 110 and the height L2 of the first wire pattern 110 may be different from each other in the transverse section 110S of the first wire pattern 110. For example, the transverse section 110S of the first wire pattern 110 may be a rectangle, but it is not limited thereto.

Figure 5B:
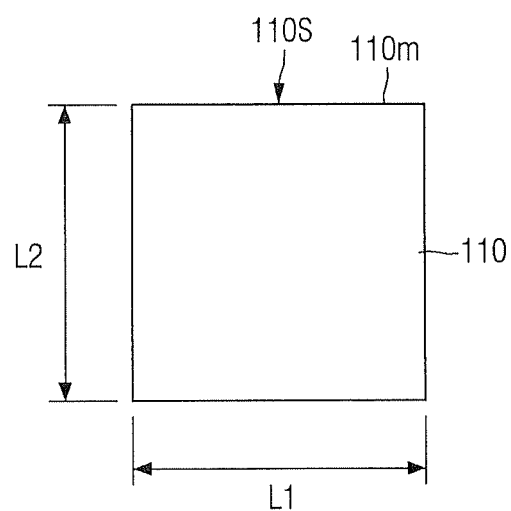

Unlike FIG. 5a, in FIG. 5b, the width L1 of the first wire pattern 110 and the height L2 of the first wire pattern 110 may be the same in the transverse section 110S of the first wire pattern 110. For example, the transverse section 110S of the first wire pattern 110 may be a square, but is not limited thereto.

Figure 5C:
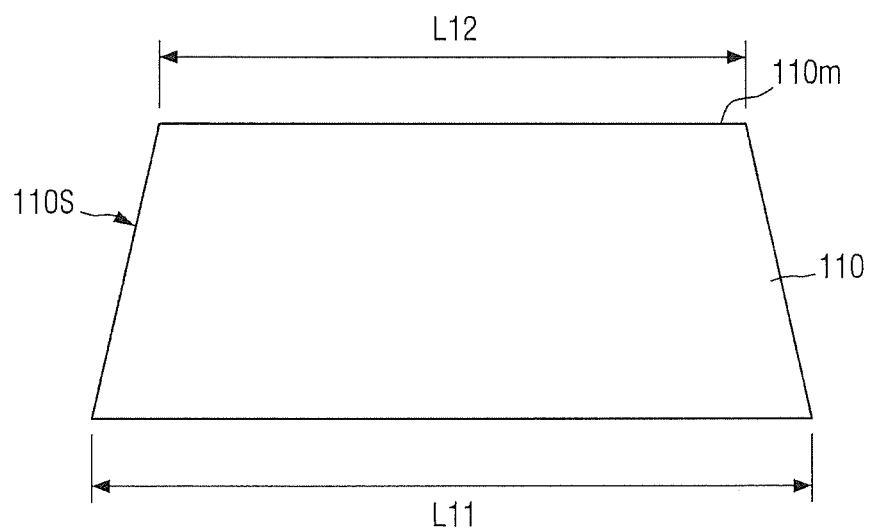

Unlike FIG. 5a, in FIG. 5c, the width L11 of one side of the first wire pattern 110 and the width L12 of the other side of the first wire pattern 110 opposite to each other may be different from each other in the transverse section 110S of the first wire pattern 110. For example, the transverse section 110S of the first wire pattern 110 may be trapezoidal, but is not limited thereto.

Figure 5D:
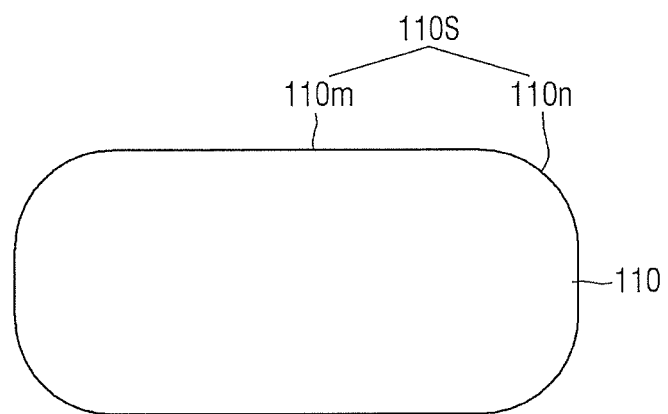

Unlike FIG. 5a, in FIG. 5d, the transverse section 110S of the first wire pattern 110 may be a figure including a combination of a straight line 110m and a curve 110n. The transverse section 110S of the first wire pattern 110 may be, for example, a rectangle with rounded corners.

Figure 5E:
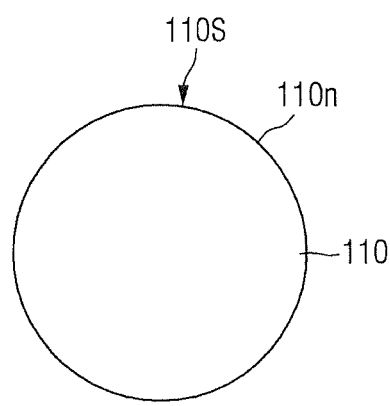

Unlike FIG. 5a, in FIG. 5e, the transverse section 110S of the first wire pattern 110 may be a figure including a combination of curves 110n to provide a generally circular shape.

In FIGS. 5a to 5e, the transverse section 110S of the first wire pattern 110 may be one of a figure including a combination of straight lines, a figure including a combination of a straight line and a curve, and a figure including a combination of curves.

A longitudinal section of the first wire pattern 110 will be described with reference to FIGS. 6a to 6c. The description of the first wire pattern 110 may be applied to the second and third wire patterns 210 and 310.

Figure 6A:
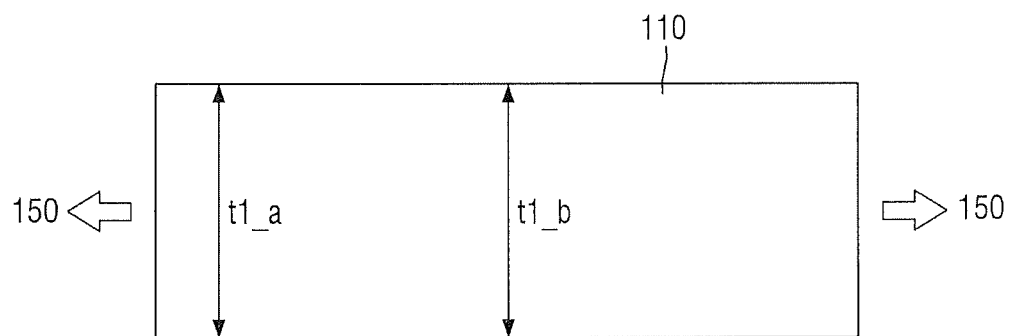
FIGS. 6a to 6c and 7 are various cross-sectional views of the first wire pattern of FIG. 1 taken along line A-A'.

In FIG. 6a, the thickness of the first wire pattern 110 may be substantially the same as it is farther away from the semiconductor pattern 150 and the gate spacer 140. For example, a thickness t1_a of the terminal end portion of the first wire pattern 110 adjacent to the semiconductor pattern 150 may be substantially the same as a thickness t1_b of the central portion of the first wire pattern 110.

Figure 6B:
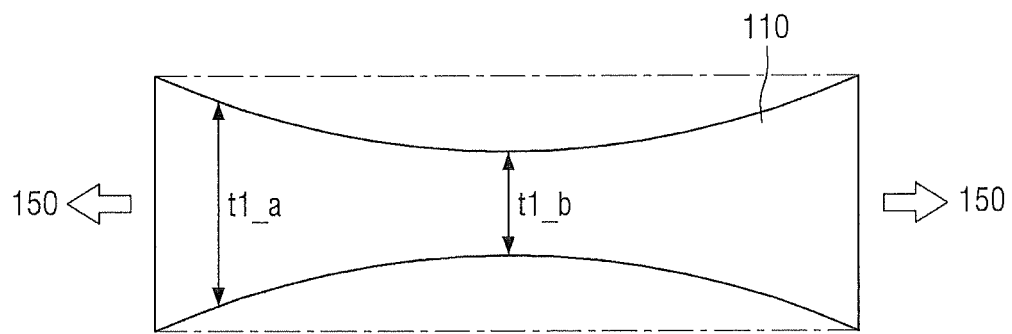

In FIG. 6b, the thickness of the first wire pattern 110 may decrease as it is farther away from the semiconductor pattern 150 and the gate spacer 140. For example, the thickness t1_a of the terminal end portion of the first wire pattern 110 adjacent to the semiconductor pattern 150 may be thicker than the thickness t1_b of the central portion of the first wire pattern 110.

Figure 6C:
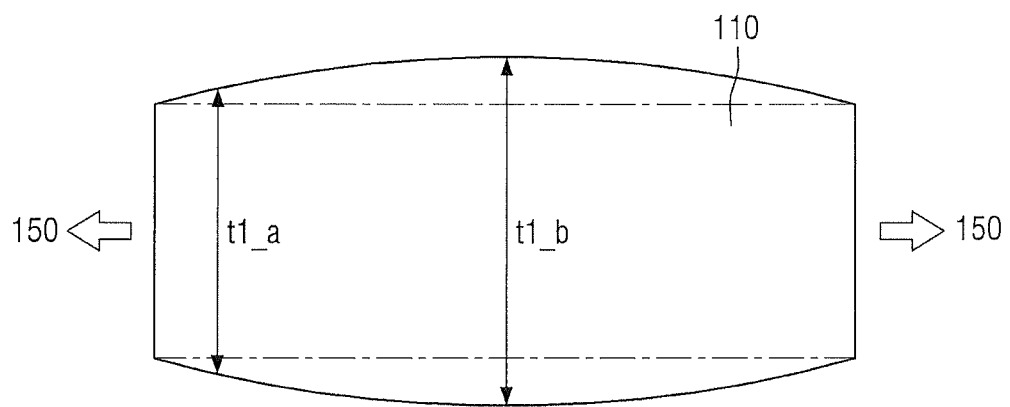

In FIG. 6c, the thickness of the first wire pattern 110 may increase as it is farther away from the semiconductor pattern 150 and the gate spacer 140. For example, the thickness t1_a of the terminal end portion of the first wire pattern 110 adjacent to the semiconductor pattern 150 may be less than the thickness t1_b of the central portion of the first wire pattern 110.

In FIGS. 6b and 6c, the thickness of the first wire pattern 110 may be changed continuously as it is farther away from the semiconductor pattern 150 and the gate spacer 140.

A longitudinal section of the first wire pattern 110 will be described with reference to FIG. 7. The description of the first wire pattern 110 may be applied to the second and third wire patterns 210 and 310.

The first wire pattern 110 may be a trimmed wire pattern. The first wire pattern 110 may include a first portion 110a and a second portion 110b. The second portion 110b of the first wire pattern 110 may be disposed on both sides around the first portion 110a of the first wire pattern 110. The second portion 110b of the first wire pattern 110 may be a portion overlapping the gate spacer 140, and the first portion 110a of the first wire pattern 110 may be a portion overlapping the gate insulating film 130 and the gate electrode 120.

The thickness t12 of the second portion 110b of the first wire pattern 110 is greater than the thickness t11 of the first portion 110a of the first wire pattern 110.

Figure 7:
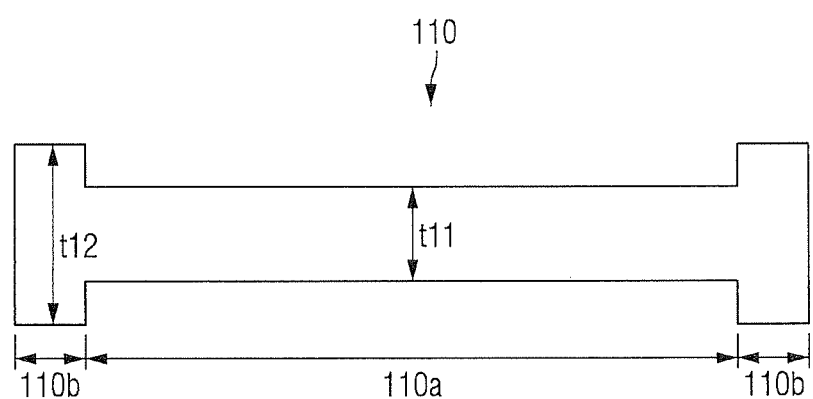

Unlike the configuration illustrated in FIG. 7, it is a matter of course that a connecting portion between the second portion 110b of the first wire pattern 110 and the first portion 110a of the first wire pattern 110 may be rounded. In FIG. 7, although the width of the first portion 110a of the first wire pattern 110 is illustrated as being constant regardless of the location, this is for the sake of convenience of description, and the present disclosure is not limited thereto. The width of the first portion 110a of the first wire pattern 110 may change as illustrated in FIG. 6b or FIG. 6c.

Figure 8:
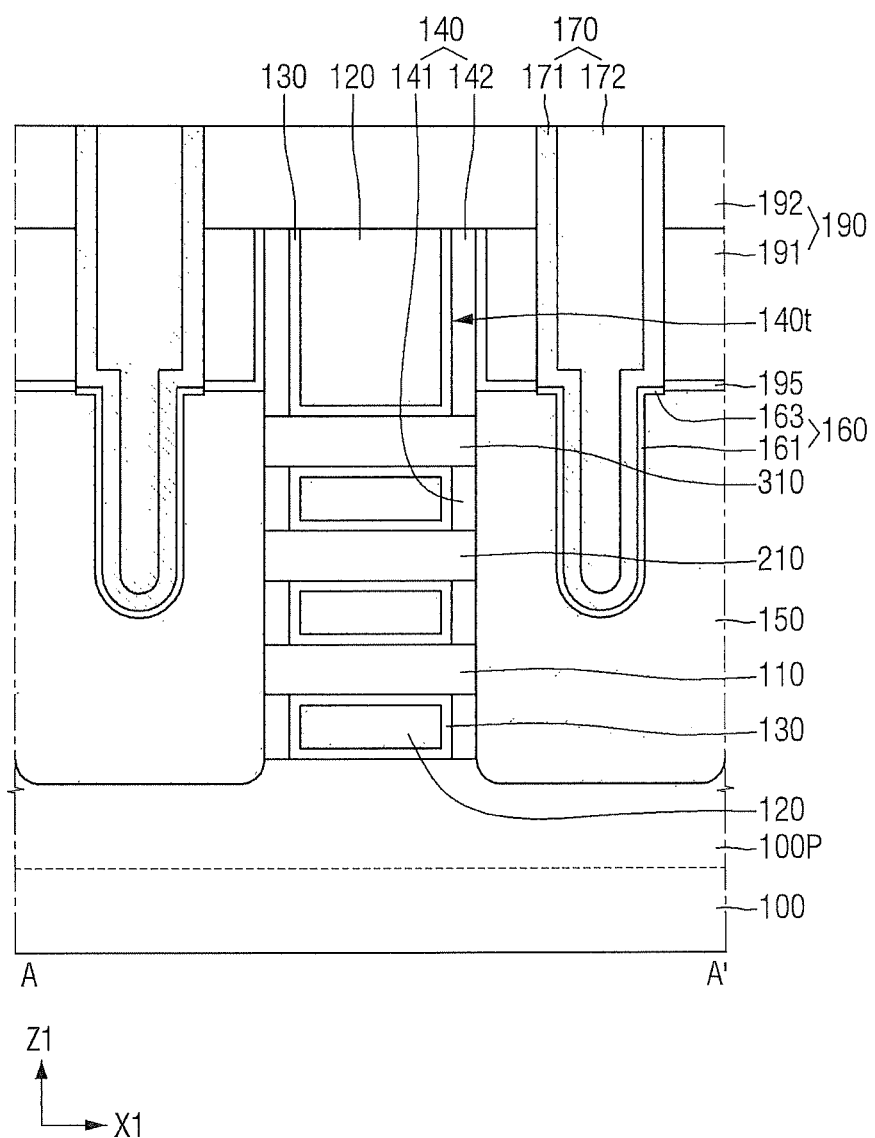
FIG. 8 is a diagram for explaining a semiconductor device according to some embodiments of the present inventive concept.
Figure 9:
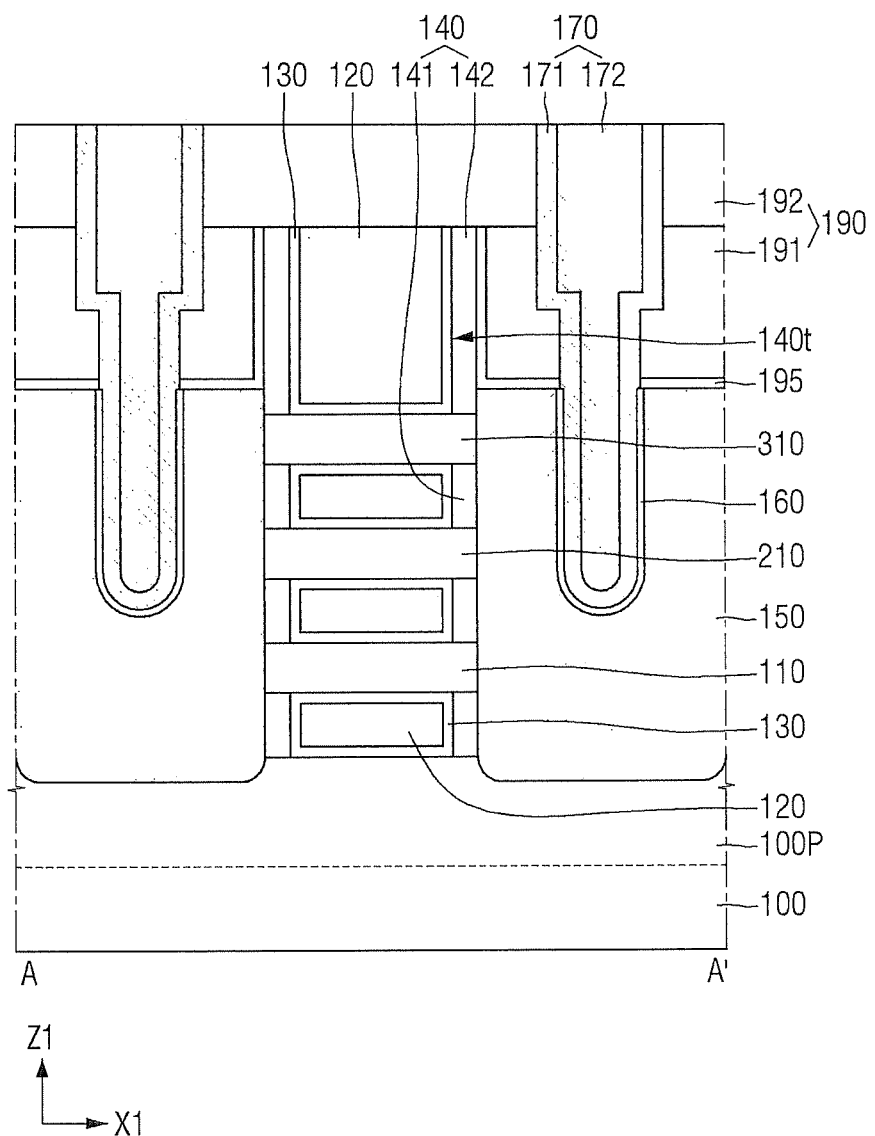
FIG. 9 is a diagram for explaining the semiconductor device according to some embodiments of the present inventive concept.
Figure 10:
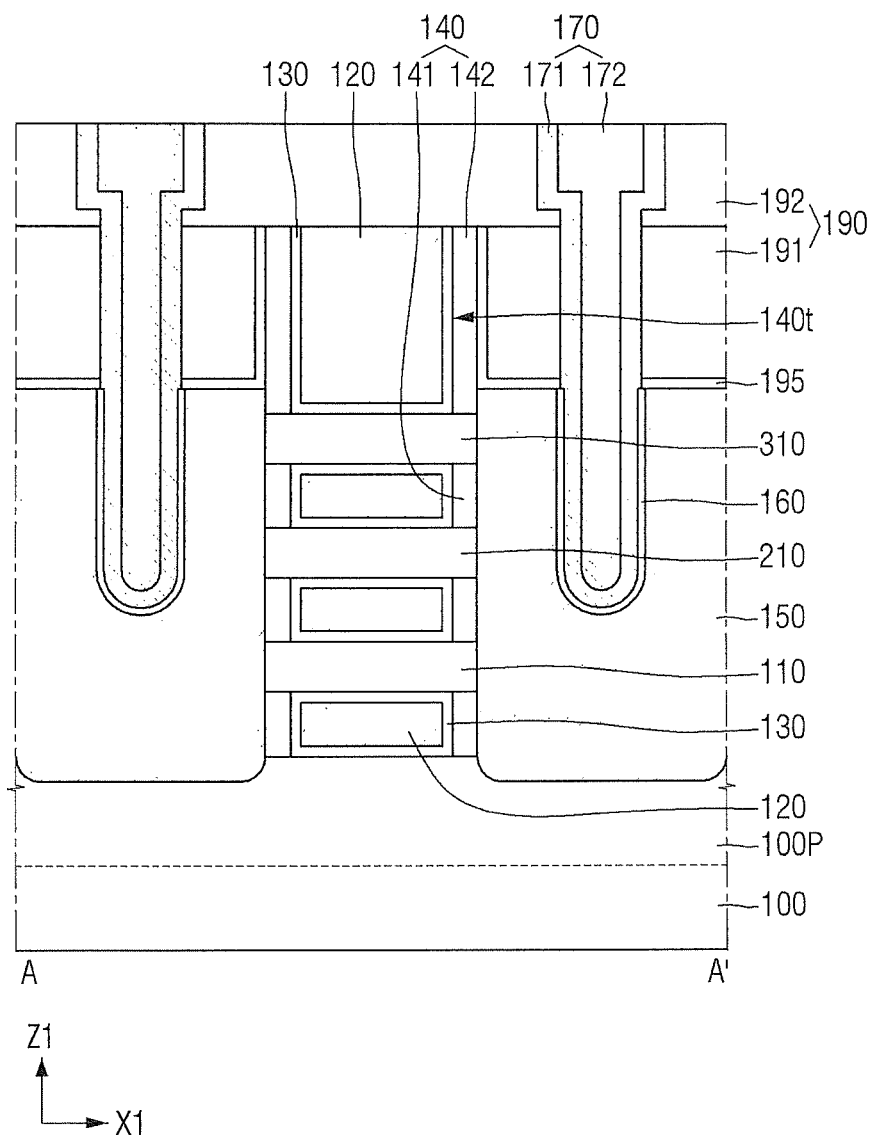
FIG. 10 is a diagram for explaining the semiconductor device according to some embodiments of the present inventive concept.

FIG. 8 is a diagram for explaining a semiconductor device according to some embodiments of the present inventive concept. FIG. 9 is a diagram for explaining the semiconductor device according to some embodiments of the present inventive concept. FIG. 10 is a diagram for explaining the semiconductor device according to some embodiments of the present inventive concept. For the sake of convenience of explanation, differences from those described with reference to FIGS. 1 to 4 will be mainly described.

Referring to FIGS. 3 and 8, in the semiconductor device according to some embodiments of the present inventive concept, the second portion 170b of the contact may not be disposed in the semiconductor pattern 150. The first portion 170a of the contact may not protrude upward from the upper surface of the semiconductor pattern 150.

The sidewalls of the second portion 170b of the contact may be wrapped by the interlayer insulating film 190. The sidewalls of the first portion 170a of the contact may be wrapped by the semiconductor pattern 150.

The silicide film 160 may include a first portion 161 extending along the first sidewall portion 171a of the barrier conductive film, and a third portion 163 extending along the connecting portion 171bb of the barrier conductive film. The silicide film 160 may not include a portion extending along the second sidewall portion 171bs of the barrier conductive film.

Unlike the illustrated configuration, the uppermost part of the silicide film 160 may not protrude upward from the upper surface of the semiconductor pattern 150.

A boundary between the first portion 170a of the contact and the second portion 170b of the contact may be the same as or higher than the upper surface of the semiconductor pattern 150.

Referring to FIGS. 3 and 9, in the semiconductor device according to some embodiments of the present inventive concept, a part of the first portion 170a of the contact may protrude upward beyond the upper surface of the semiconductor pattern 150.

For example, a part of the sidewall of the first portion 170a of the contact may be wrapped by the interlayer insulating film 190.

The silicide film 160 may include only a portion extending along the first sidewall portion 171a of the barrier conductive film. The silicide film 160 may extend along a part of the profile of the first portion 170a of the contact. The silicide film 160 does not include a portion that extends along the profile of the upper portion 171b of the barrier conductive film.

A boundary between the first portion 170a of the contact and the second portion 170b of the contact may be higher than the upper surface of the semiconductor pattern 150 and may be lower than the upper surface of the gate spacer 140. The boundary between the first portion 170a of the contact and the second portion 170b of the contact may be higher than the uppermost part of the silicide film 160.

Referring to FIGS. 3 and 10, in the semiconductor device according to some embodiments of the present inventive concept, a part of the first portion 170a of the contact may protrude upward from the upper surface of the gate spacer 140.

The silicide film 160 may include only a portion extending along the first sidewall portion 171a of the barrier conductive film. The silicide film 160 does not include a portion extending along the profile of the upper portion 171b of the barrier conductive film.

The boundary between the first portion 170a of the contact and the second portion 170b of the contact may be higher than the upper surface of the semiconductor pattern 150, and may be higher than the upper surface of the gate spacer 140 and the upper surface of the gate electrode 120.

Unlike the illustrated configuration, the boundary between the first portion 170a of the contact and the second portion 170b of the contact may be located at the same height as the upper surface of the gate spacer 140 and the upper surface of the gate electrode 120.

Figure 11:
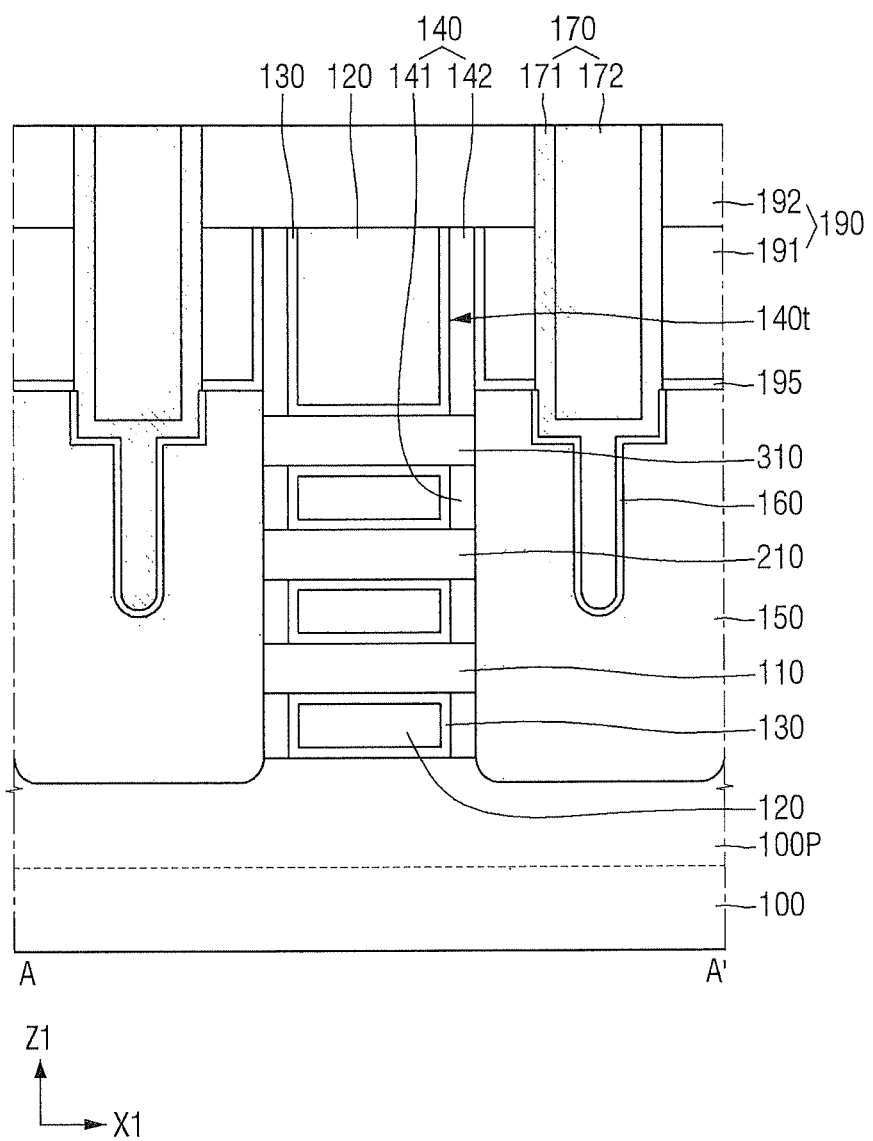
Figure 12A:
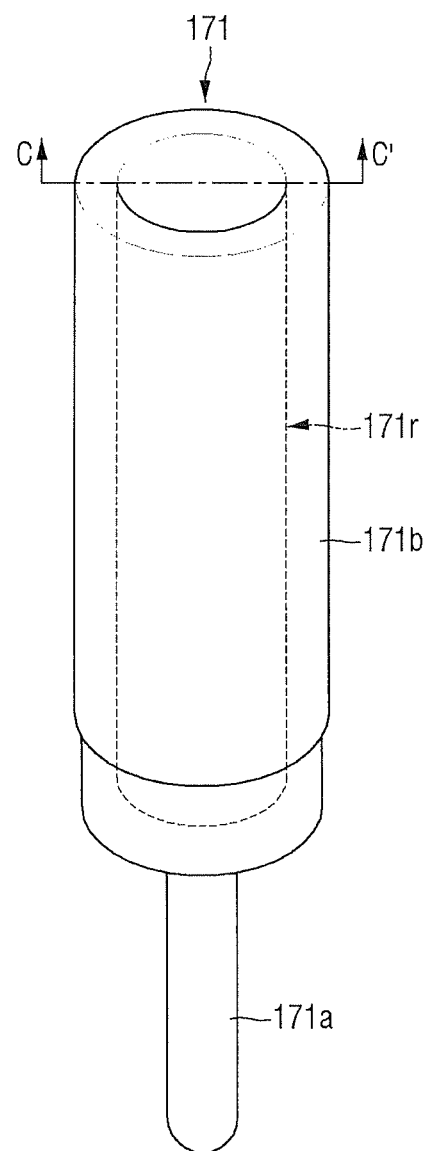
FIG. 12a is a diagram illustrating a barrier conductive film of FIG. 11.
Figure 12B:
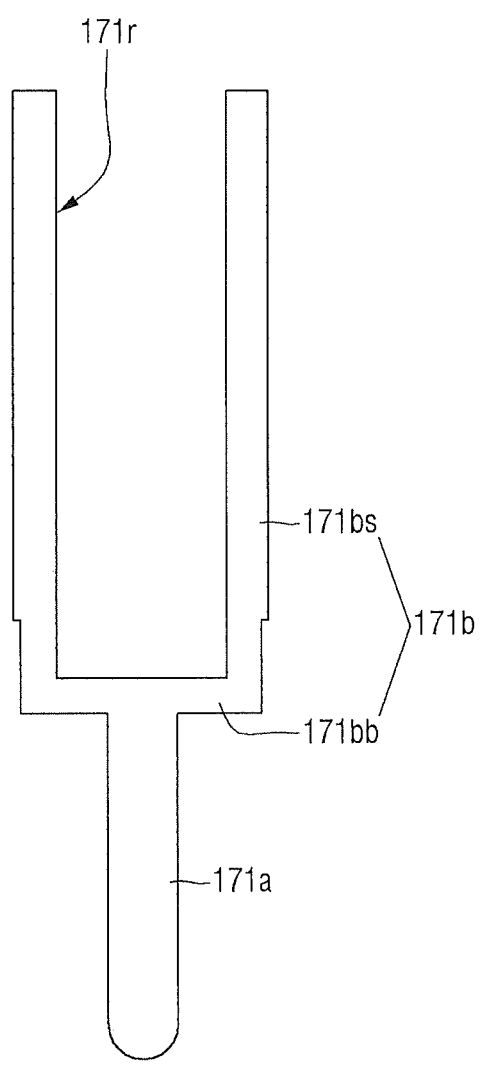

FIG. 1 is a diagram for explaining the semiconductor device according to some embodiments of the present inventive concept. FIG. 12a is a diagram illustrating the barrier conductive film of FIG. 11. FIG. 12b is a cross-sectional view taken along line C-C of FIG. 12b. For the sake of convenience of explanation, differences from those described with reference to FIGS. 1 to 4 will be mainly described.

Referring to FIGS. 3 and 11 to 12b, in the semiconductor device according to some embodiments of the present inventive concept, the first portion 170a of the contact may not include the filling conductive film 172. The first portion 170a of the contact may include only the first sidewall portion 171a of the barrier conductive film, and may not include the filling conductive film 172.

Unlike the configuration illustrated in FIG. 3, the first sidewall portion 171a of the barrier conductive film which is a lower portion of the barrier conductive film may be rod shaped and extend in a direction away from the substrate 100. Therefore, the first sidewall portion 171a of the barrier conductive film does not include a recessed space in which the filling conductive film 172 may be filled.

The second portion 170b of the contact may include an upper portion 171b of the barrier conductive film, and a filling conductive film 172 on the upper portion 171b of the barrier conductive film.

The upper portion 171b of the barrier conductive film may include a contact recess 171r defined by the connecting portion 171bb of the barrier conductive film and the second sidewall portion 171bs of the barrier conductive film. The second portion 170b of the contact may include a contact recess 171r defined by the barrier conductive film 171. The bottom surface of the contact recess 171r is defined by the connecting portion 171bb of the barrier conductive film, and the sidewall of the contact recess 171r may be defined by the second sidewall portion 171bs of the barrier conductive film. The filling conductive film 172 may fill the contact recess 171r.

Figure 13:
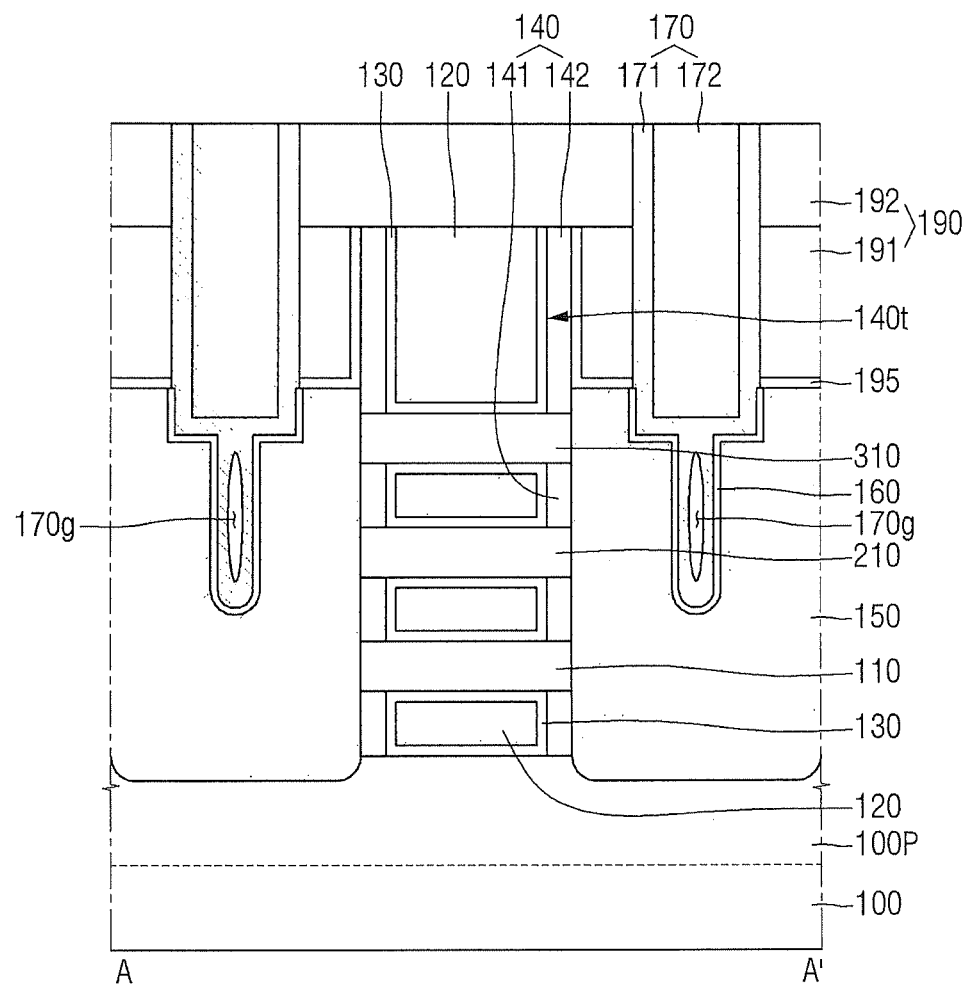
FIG. 13 is a diagram for explaining a semiconductor device according to some embodiments of the present inventive concept.

FIG. 13 is a diagram for explaining the semiconductor device according to some embodiments of the present inventive concept. For the sake of convenience of explanation, differences from those described with reference to FIGS. 11 to 12B will be mainly described.

Referring to FIG. 13, in the semiconductor device according to some embodiments of the present inventive concept, the contact 170 may include an air gap 170g. It will be understood that the term "air gap" can include gaps that include other gases besides air or can be a void.

The air gap 170g may be included in the first portion 170a of the contact. The air gap 170g may be wrapped by, for example, the barrier conductive film 171.

Figure 14:
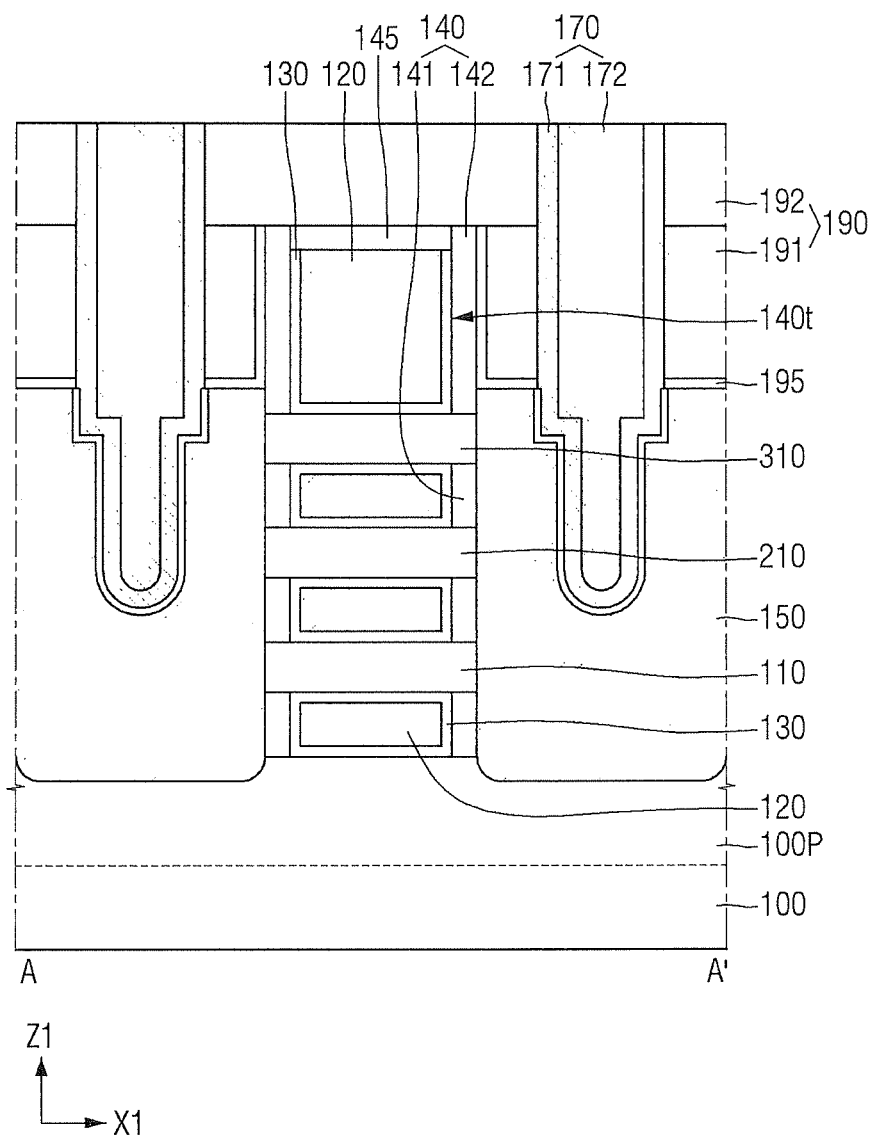
FIG. 14 is a diagram for explaining a semiconductor device according to some embodiments of the present inventive concept.

FIG. 14 is a diagram for explaining the semiconductor device according to some embodiments of the present inventive concept. For the sake of convenience of explanation, differences from those described with reference to FIGS. 1 to 4 will be mainly described.

Referring to FIG. 14, the semiconductor device according to some embodiments of the present inventive concept may further include a capping pattern 145.

The gate electrode 120 may fill a part of the gate trench 140t. The capping pattern 145 may be formed on the gate electrode 120. The capping pattern 145 may fill the remainder of the gate trench 140t which is left after the gate electrode 120 is formed.

Although FIG. 14 illustrates the configuration in which the gate insulating film 130 is not formed between the gate spacer 140 and the capping pattern 145, this is only for the sake of convenience of explanation, and the present disclosure is not limited thereto.

The upper surface of the capping pattern 145 may be placed on the same plane as the upper surface of the lower interlayer insulating film 191. The capping pattern 145 may include, for example, a material having an etching selectivity to the lower interlayer insulating film 191. The capping pattern 145 may include, for example, at least one of silicon nitride (SiN), silicon oxynitride (SiON), silicon oxide (SiO2), silicon carbonitride (SiCN), silicon oxycarbonitride (SiOCN), and combinations thereof.

FIGS. 15 to 23 are intermediate step diagrams for explaining a method for fabricating a semiconductor device according to some embodiments of the present inventive concept. For reference, FIGS. 16 to 23 illustrate the fabricating method performed using the cross-sectional view taken along the line D-D of FIG. 15, respectively. In addition, the semiconductor device fabricated using FIGS. 15 to 23 may be those described with reference to FIGS. 1 to 4.

Figure 15:
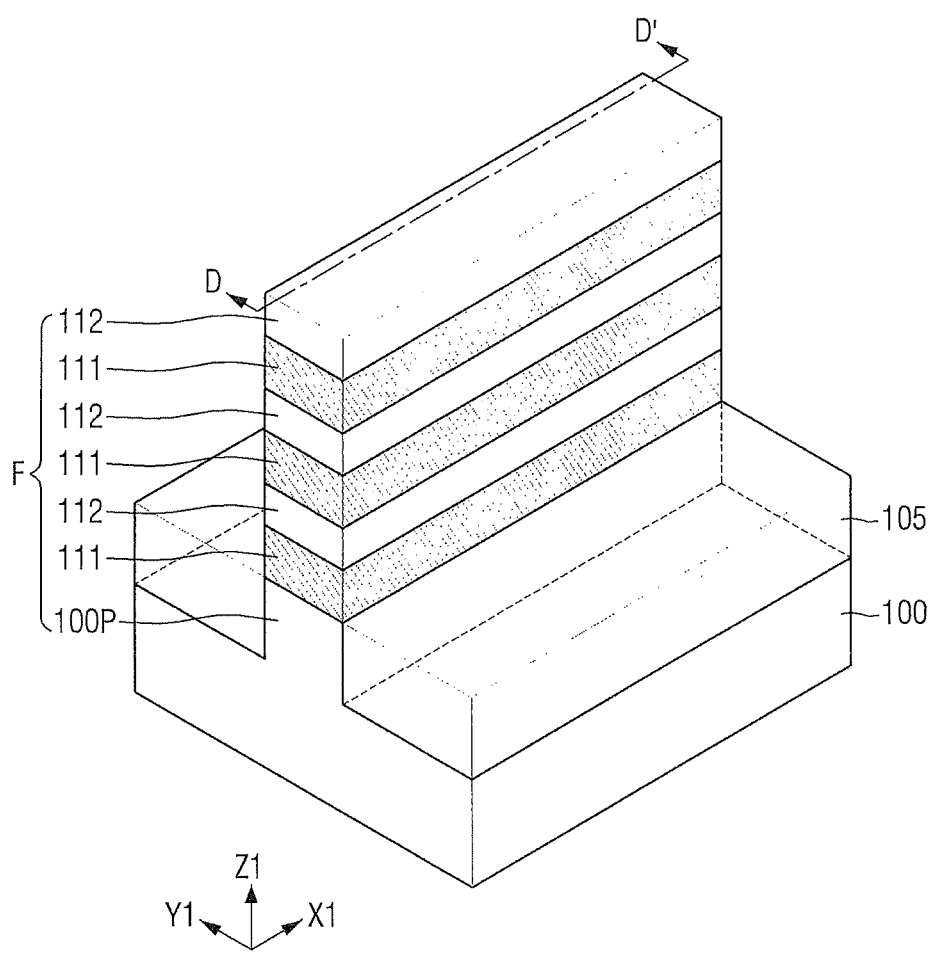
FIGS. 15 to 23 are intermediate step diagrams taken along cross-sectional line D-D' of FIG. 15 for explaining a method for fabricating the semiconductor device according to some embodiments of the present inventive concept.

Referring to FIG. 15, a fin-like structure F may be formed on the substrate 100. The fin-like structure F may extend long in the first direction X1.

The fin-like structure F may include a fin-like protrusion 100P, a sacrificial pattern 111, an active pattern 112, a sacrificial pattern 111, an active pattern 112, a sacrificial pattern 111, and an active pattern 112 which are sequentially laminated on the substrate 100. Since the fin structure F extends in the first direction X1, each of the sacrificial pattern 111 and the active pattern 112 may extend in the first direction X1.

The active pattern 112 may include a material having an etching selectivity to the sacrificial pattern 111.

A field insulating film 105 which covers at least a part of the sidewalls of the fin-like structure F may be formed on the substrate 100.

In FIG. 15, although the active pattern 112 is illustrated as being located on the uppermost part of the fin-like structure F, the present disclosure is not limited thereto. In addition, although the fin-like structure F is illustrated to include three active patterns 112 formed on the substrate 100, the present disclosure is not limited thereto.

Figure 16:
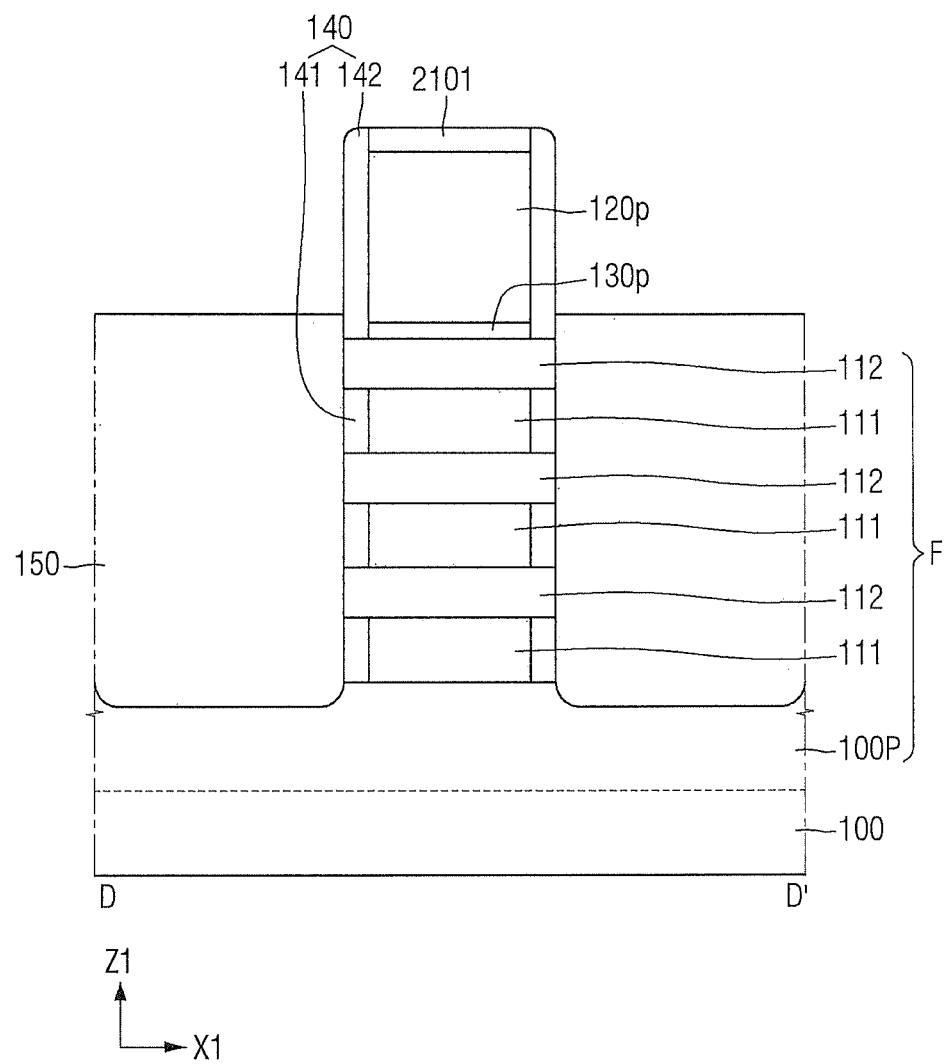

Referring to FIG. 16, a dummy gate electrode 120p intersecting with the fin-like structure F and extending in the second direction (Y1 of FIG. 15) may be formed.

A dummy gate insulating film 130p may be formed between the dummy gate electrode 120p and the fin-like structure F. A hard mask pattern 2101 may be located on the dummy gate electrode 120p.

An outer spacer 142 may be formed on the sidewall of the dummy gate electrode 120p. A part of the fin-like structure F may be removed by utilizing the dummy gate electrode 120p and the outer spacer 142 as a mask.

After removing a part of the fin-like structure F, an inner spacer 141 is formed between the active pattern 112 and the fin-like protrusion 100P. An inner spacer 141 is also formed between the active patterns 112 on the fin-like protrusions 100P. Therefore, the gate spacer 140 is formed.

It is possible to remove at least a part of the sacrificial pattern 111 overlapping the outer spacer 142, for example, using the etching selectivity between the active pattern 112 and the sacrificial pattern 111. The inner spacer 141 may be formed on a portion from which a part of the sacrificial pattern 111 is removed.

The semiconductor patterns 150 may be formed on the substrate 100 on both sides of the dummy gate electrode 120p and the gate spacer 140. The semiconductor pattern 150 may be formed on the fin-like protrusion 100P. The semiconductor pattern 150 may be connected to the active pattern 112.

Figure 17:
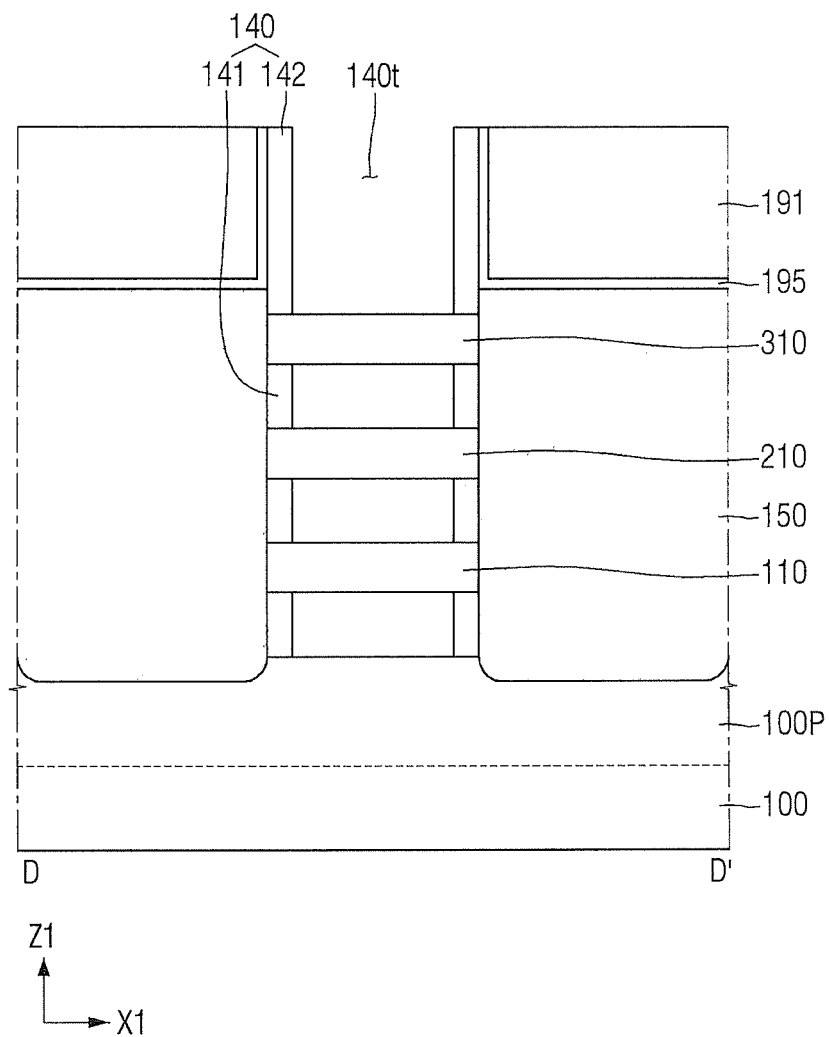

Referring to FIGS. 16 and 17, an etching stop film 195 may be formed on the sidewalls of the semiconductor pattern 150 and the outer spacer 142. A lower interlayer insulating film 191 may be formed on the etching stop film 195. The dummy gate electrode 120p may be exposed by the lower interlayer insulating film 191. During the formation of the lower interlayer insulating film 191, the hard mask pattern 2101 may be removed.

By removing the dummy gate electrode 120p, the dummy gate insulating film 130p, and the sacrificial pattern 111, the first to third wire patterns 110, 210, and 310 sequentially disposed on the substrate 100 may be formed. The first wire pattern 110 may be formed to be spaced apart from the fin-like protrusion 100P.

The gate trench 140t defined by the gate spacer 140 may be formed by removing the dummy gate electrode 120p, the dummy gate insulating film 130p, and the sacrificial pattern 111.

Figure 18:
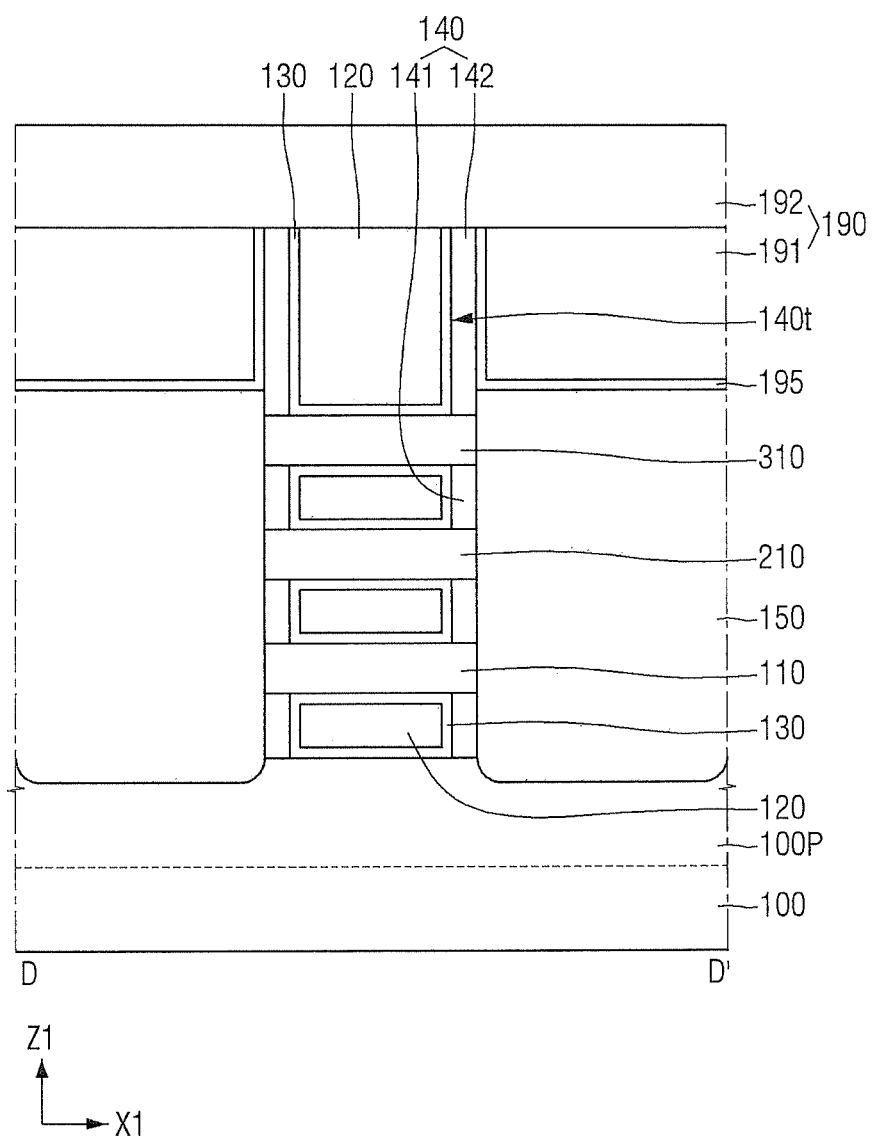

Referring to FIG. 18, the gate insulating film 130 and the gate electrode 120 are formed on the substrate 100. The gate insulating film 130 may be formed along the sidewalls and the bottom surface of the gate trench 140t and the circumferences of the first to third wire patterns 110, 210 and 310.

The gate electrode 120 is formed on the gate insulating film 130 and may fill the gate trench 140t. The gate electrode 120 may wrap around the first to third wire patterns 110, 210, and 310. A wire pattern in which the gate electrode 120 wraps around the circumference may not be disposed between the substrate 100 and the first wire pattern 110.

An upper interlayer insulating film 192 is formed on the gate electrode 120 and the lower interlayer insulating film 191.

Figure 19:
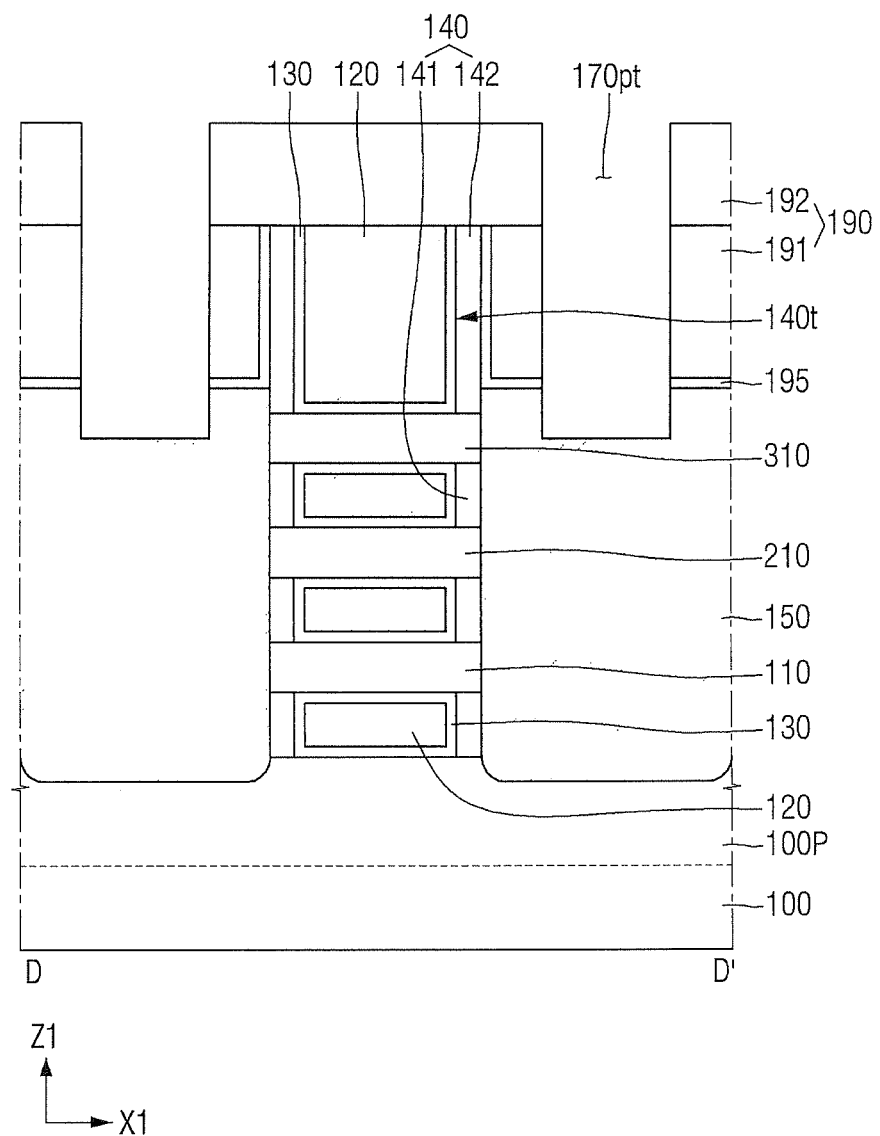

Referring to FIG. 19, a pre-contact trench 170pt may be formed in the interlayer insulating film 190. The pre-contact trench 170pt may extend into the semiconductor pattern 150 to expose the semiconductor pattern 150.

Figure 20:
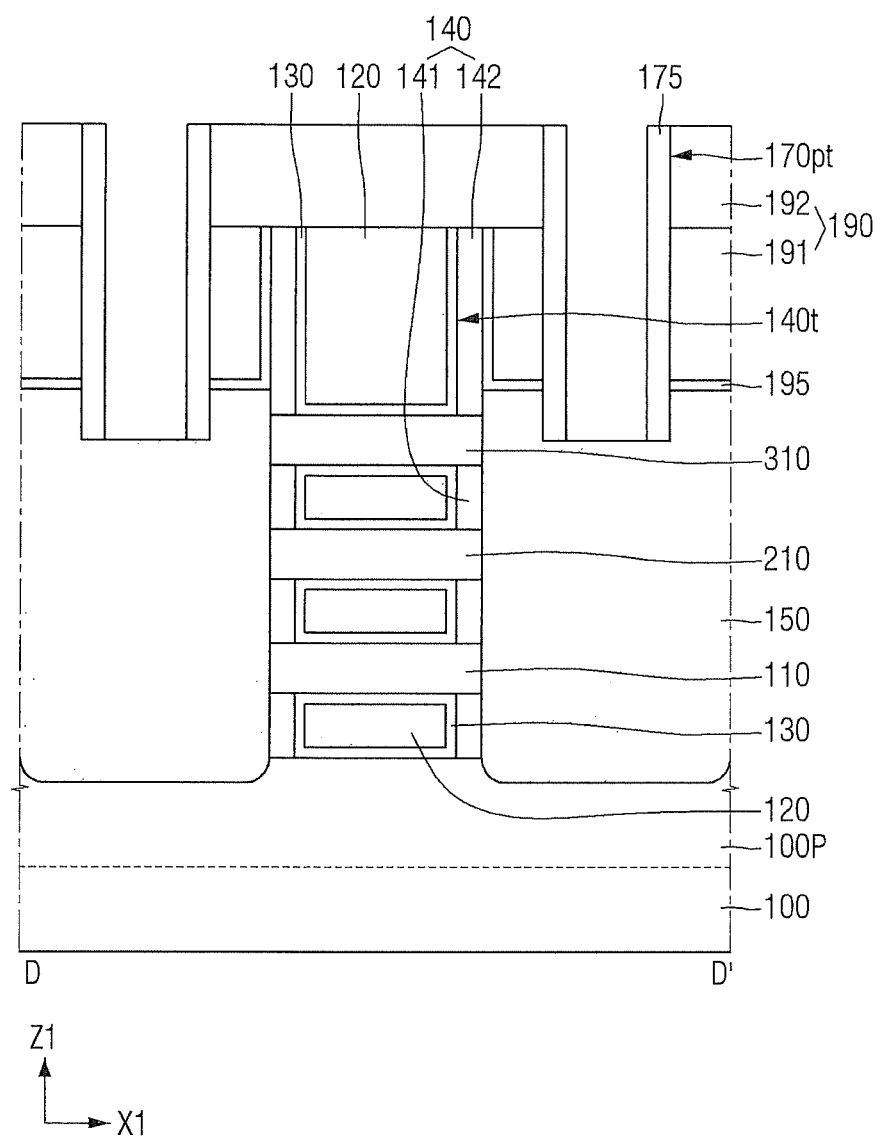

Referring to FIG. 20, trench liners 175 may be formed along the sidewalls of the pre-contact trench 170pt.

Since the trench liner 175 is formed, the area of the exposed semiconductor pattern 150 decreases.

Figure 21:
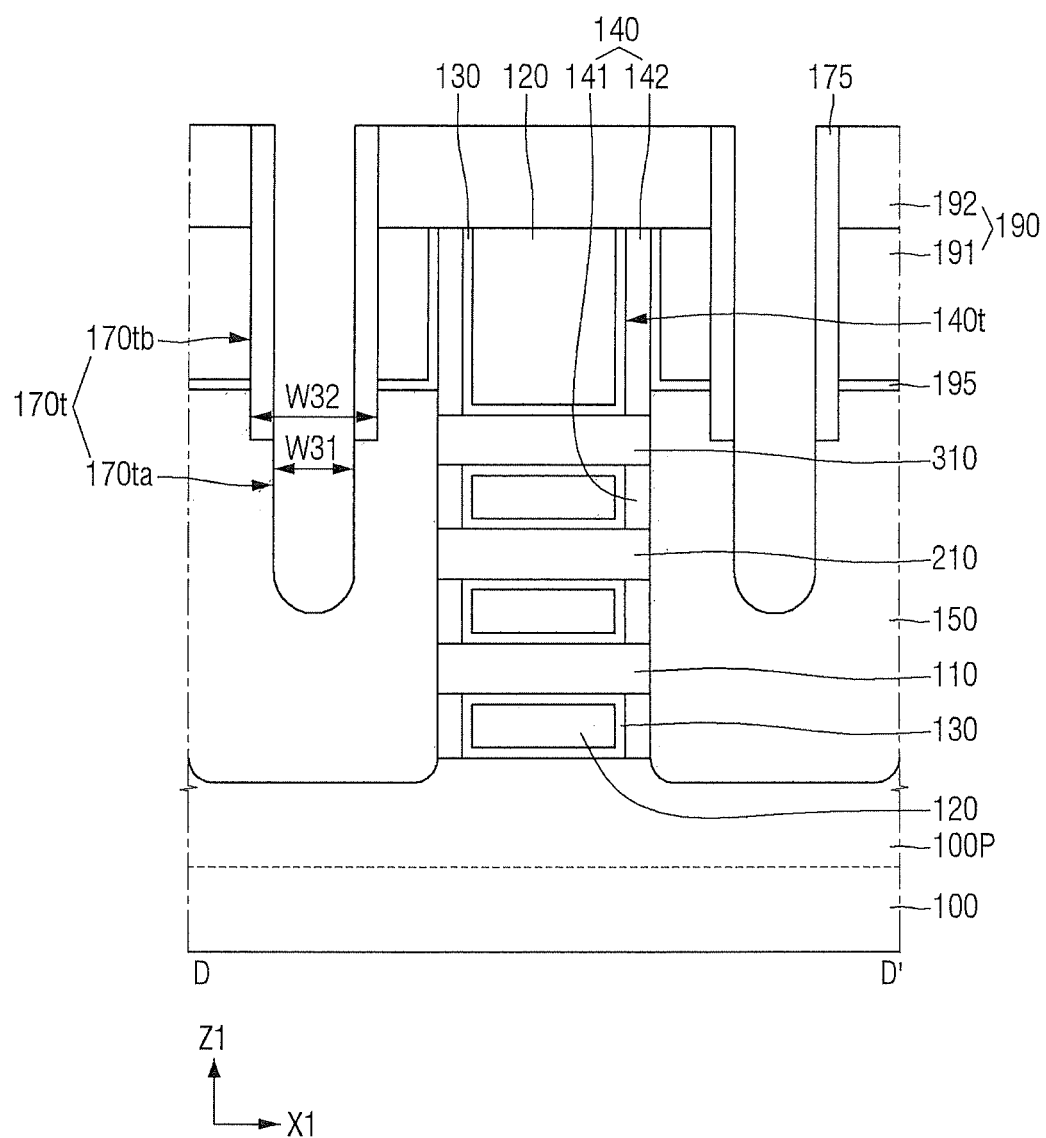

Referring to FIG. 21, a part of the semiconductor pattern 150 may be removed, using the trench liner 175. Since a part of the exposed semiconductor pattern 150 is removed by the trench liner 175, a first portion 170ta of the contact trench may be formed.

A second portion 170tb of the contact trench may be a pre-contact trench (170pt of FIG. 20) in which the trench liner 175 is formed.

The contact trench 170t includes a first portion 170ta of the contact trench, and a second portion 170tb of the contact trench on the first portion 170ta of the contact trench.

For example, at the boundary between the first portion 170ta of the contact trench and the second portion 170tb of the contact trench, the width W31 of the first portion 170ta of the contact trench is smaller than the width W32 of the second portion 170tb of the contact trench.

Figure 22:
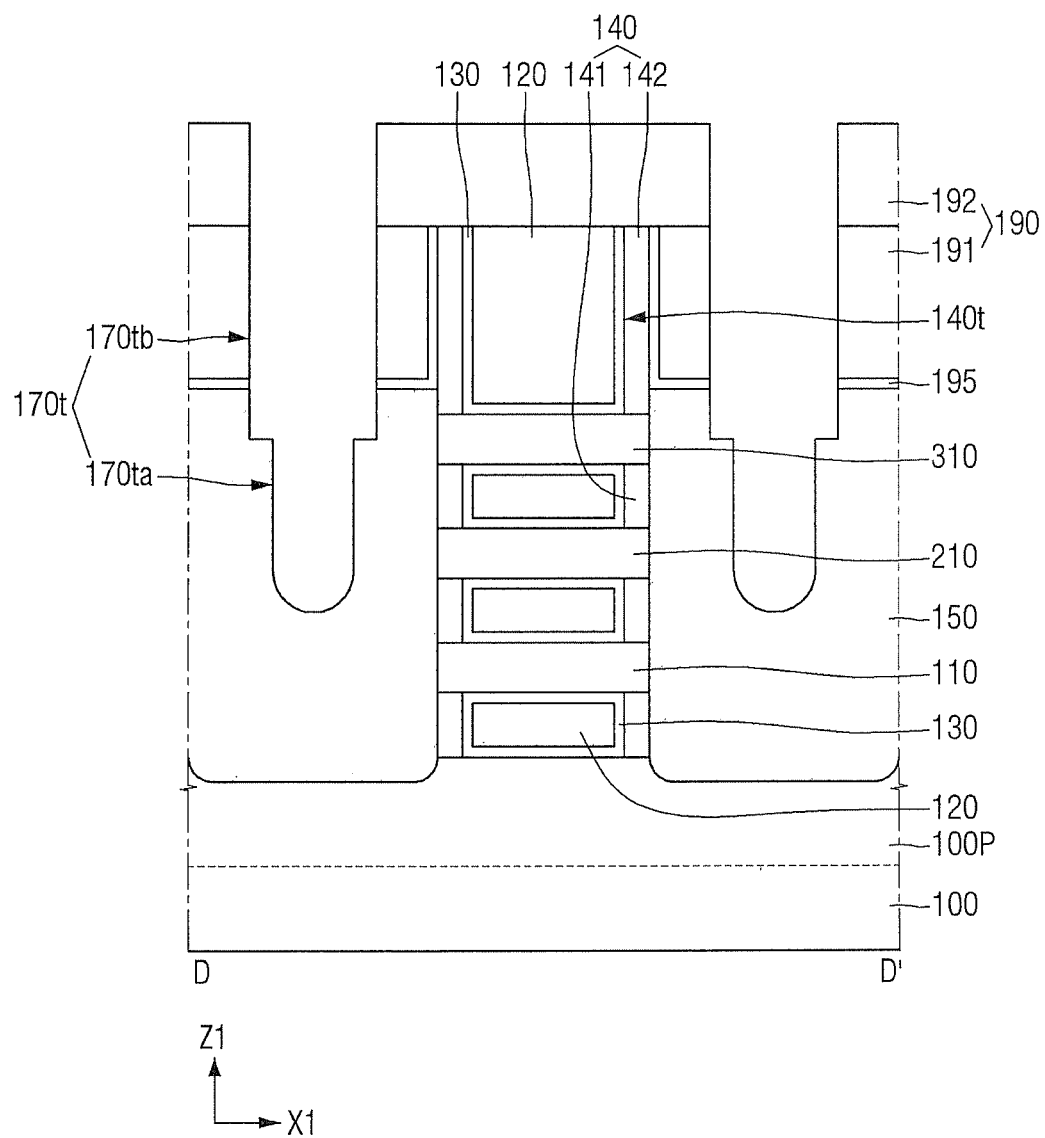

Referring to FIG. 22, the trench liner 175 disposed along the second portion 170tb of the contact trench is removed.

Figure 23:
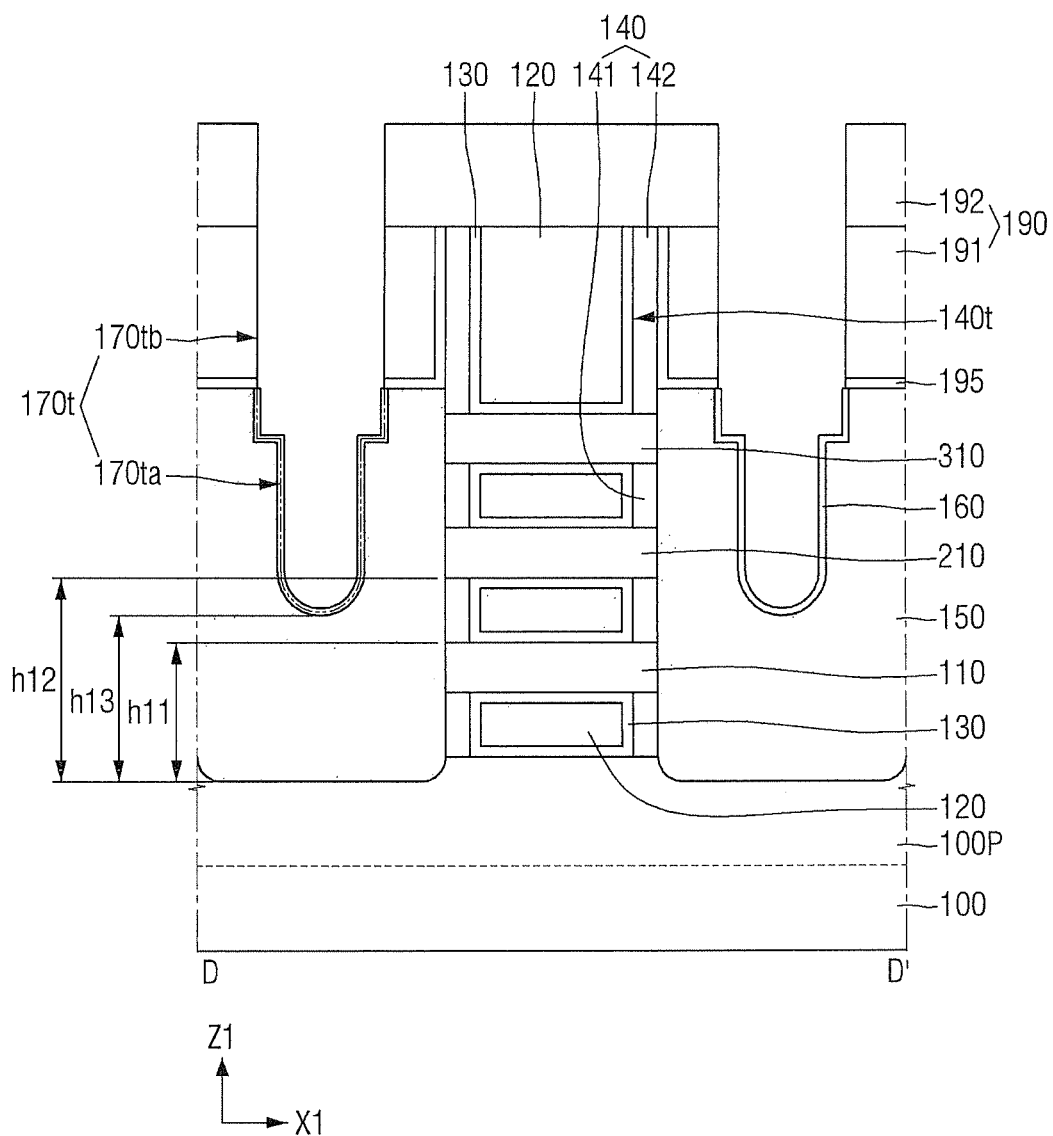

Referring to FIG. 23, a silicide film 160 is formed along at least a part of the contact trench 170t. Since the silicide film 160 uses a part of the semiconductor pattern 150, the contact boundary between the silicide film 160 and the semiconductor pattern 150 may be expanded further than the first portion 170ta of the contact trench.

At this time, the lowermost part of the silicide film 160 may be located between the uppermost part of the first wire pattern 110 and the lowermost part of the second wire pattern 210.

Next, a contact 170 which fills the contact trench 170t may be formed on the silicide film 160.

Figure 24:
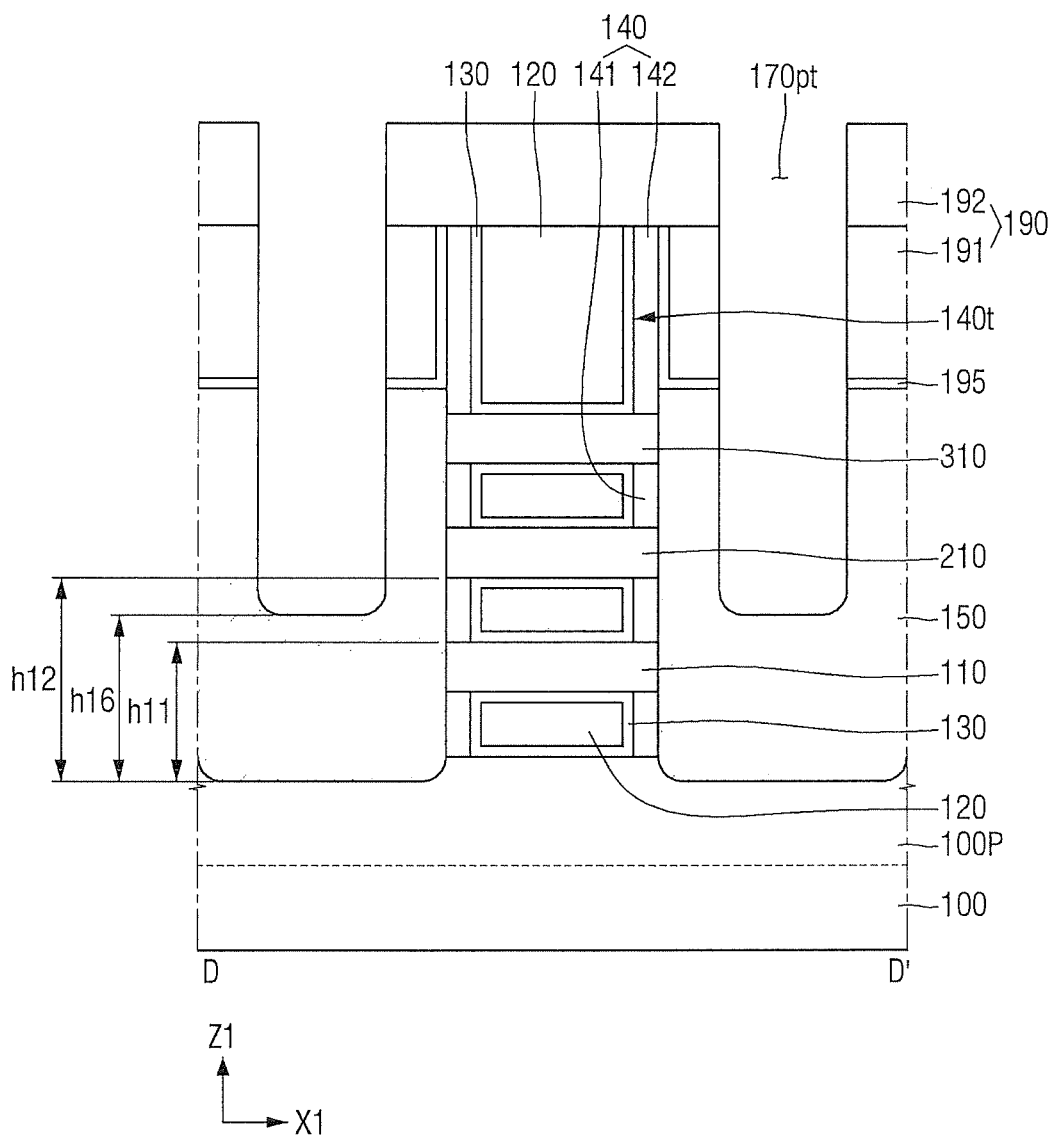
FIGS. 24 and 25 are intermediate step diagrams taken along cross-sectional line D-D' of FIG. 15 for explaining a method for fabricating the semiconductor device according to some embodiments of the present inventive concept.
Figure 25:
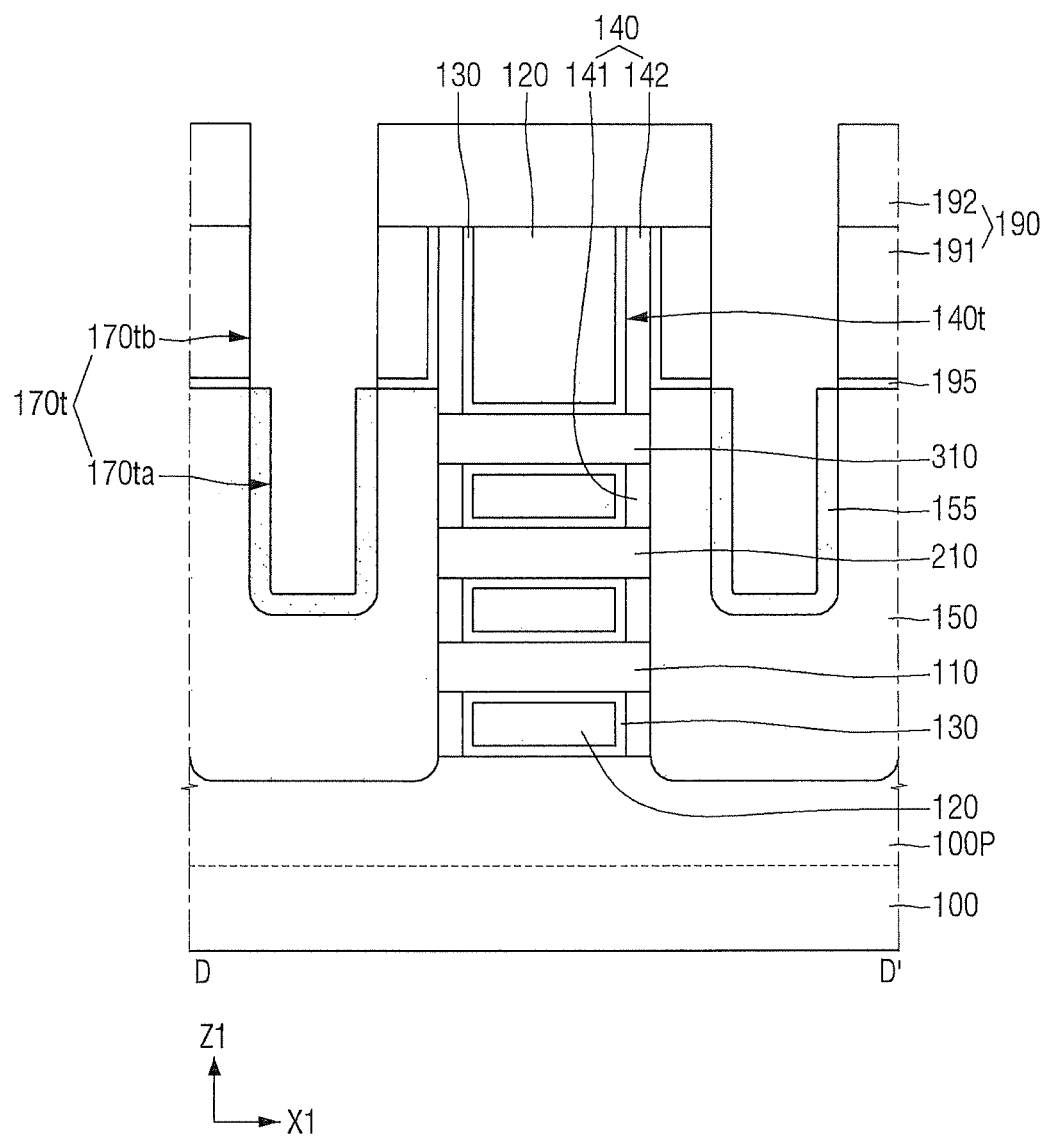

FIGS. 24 and 25 are intermediate step diagrams for explaining a method for fabricating a semiconductor device according to some embodiments of the present inventive concept.

FIG. 24 may be a fabricating method performed after FIG. 18. FIGS. 24 and 25 may be an example for fabricating the semiconductor device described with reference to FIG. 8.

Referring to FIG. 24, a pre-contact trench 170pt may be formed in the interlayer insulating film 190 and the semiconductor pattern 150.

The pre-contact trench 170pt penetrates through the interlayer insulating film 190 and may extend into the semiconductor pattern 150.

For example, the height h16 from the bottom surface of the semiconductor pattern 150 to the bottom surface of the pre-contact trench 170pt may be greater than the height h11 from the bottom surface of the semiconductor pattern 150 to the uppermost part of the first wire pattern, and may be less than the height h12 from the bottom surface of the semiconductor pattern 150 to the lowermost part of the second wire pattern 210.

However, the height h16 from the bottom surface of the semiconductor pattern 150 to the bottom of the pre-contact trench 170pt may be less than the height h11 from the bottom surface of the semiconductor pattern 150 to the uppermost part of the first wire pattern 110, depending on the thickness of the semiconductor liner (155 of FIG. 25).

Referring to FIG. 25, a semiconductor liner 155 may be formed along the pre-contact trench 170pt defined by the semiconductor pattern 150.

A first portion 170ta of the contact trench may be formed by the semiconductor liner 155. The second portion 170tb of the contact trench may be a portion of the pre-contact trench (170pt of FIG. 24) defined by the interlayer insulating film 190.

The semiconductor liner 155 may include the same material as the semiconductor pattern 150, or may include different materials.

Next, a silicide film 160 may be formed using the semiconductor liner 155.

While the present inventive concept has been particularly illustrated and described with reference to exemplary embodiments thereof, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

What is claimed:

1. A semiconductor device comprising:
a channel region disposed above a substrate, the channel region including first, second, and third wire patterns spaced apart from one another in numerical order;
a gate electrode which wraps around the first, second, and third wire patterns;
a semiconductor pattern disposed on one side of the gate electrode over the substrate;
an interlayer insulating film on the semiconductor pattern;
a contact including a first portion and a second portion, the second portion in the interlayer insulating film and the first portion embedded in the semiconductor pattern; and
a silicide film extending along a profile of the contact between the contact and the semiconductor pattern,
wherein the first wire pattern comprises a lowermost wire pattern in the channel region, and
a lowermost part of the silicide film is located between an uppermost part of the first wire pattern and a lowermost part of the second wire pattern.

2. The semiconductor device of claim 1,
wherein the second portion is on the first portion,
a width of the first portion of the contact is less than a width of the second portion of the contact at a boundary between the first portion of the contact and the second portion of the contact.

3. The semiconductor device of claim 2,
wherein the boundary between the first portion of the contact and the second portion of the contact is lower than an upper surface of the semiconductor pattern.

4. The semiconductor device of claim 1,
wherein the contact comprises a barrier conductive film and a filling conductive film on the barrier conductive film.

5. The semiconductor device of claim 4,
wherein the barrier conductive film includes a rod shaped first portion extending in a direction away from the substrate, and a second portion including a contact recess on the first portion; and
wherein the filling conductive film fills the contact recess.

6. The semiconductor device of claim 1,
wherein the silicide film is between the first to third wire patterns and the semiconductor pattern.

7. The semiconductor device of claim 1, further comprising:
a gate insulating film along circumferences of the first, second, and third wire patterns, wherein the gate electrode is disposed on the gate insulating film.

8. The semiconductor device of claim 1, further comprising:
a fin-shaped protrusion protruding from the substrate, wherein the first wire pattern is disposed on the fin-shaped protrusion.

9. A semiconductor device comprising:
a channel region disposed above a substrate, the channel region including first, second, and third wire patterns spaced apart from one another in numerical order;
a gate spacer defining a gate trench in the substrate;
a gate electrode which wraps around the first, second, and third wire patterns in the gate trench;
a semiconductor pattern on one side of the gate electrode on the substrate;
an interlayer insulating film which wraps around a sidewall of the gate spacer on the semiconductor pattern;
a contact in the semiconductor pattern and in the interlayer insulating film,
wherein the contact includes a first portion and a second portion on the first portion,
the first portion is disposed in the semiconductor pattern, and
the second portion is disposed in the interlayer insulating film and extends toward the first portion; and
a silicide film between the contact and the semiconductor pattern,
wherein a width of the first portion of the contact away from a boundary between the first portion of the contact and the second portion of the contact is less than a width of the second portion of the contact, at the boundary, wherein the first wire pattern comprises a lowermost wire pattern in the channel region; and
a lowermost part of the silicide film is located between an uppermost part of the first wire pattern and a lowermost part of the second wire pattern.

10. The semiconductor device of claim 9,
wherein the boundary between the first portion of the contact and the second portion of the contact is lower than an upper surface of the gate spacer.

11. The semiconductor device of claim 10, wherein the boundary between the first portion of the contact and the second portion of the contact is lower than an upper surface of the gate electrode.

12. The semiconductor device of claim 9, wherein the contact includes a barrier conductive film, and a filling conductive film on the barrier conductive film, and
the filling conductive film is absent from the first portion of the contact.

13. The semiconductor device of claim 9, wherein the silicide film extends along a profile of the first portion of the contact between the first portion of the contact and the semiconductor pattern.

14. The semiconductor device of claim 9, wherein a sidewall of the first portion of the contact is wrapped by the interlayer insulating film.

15. The semiconductor device of claim 9, wherein the silicide film is between the first to third wire patterns and the semiconductor pattern.

16. A semiconductor device comprising:
a channel region disposed above a substrate, the channel region including first, second, and third wire patterns spaced apart from one another in numerical order;
a gate spacer defining a gate trench in the substrate;
a gate electrode which wraps around the first, second, and third wire patterns in the gate trench;
a semiconductor pattern on one side of the gate electrode on the substrate;
an interlayer insulating film which wraps around a sidewall of the gate spacer on the semiconductor pattern; and
a contact including a barrier conductive film and a filling conductive film on the barrier conductive film, in the semiconductor pattern and in the interlayer insulating film,
wherein the contact includes a first portion, and a second portion on the first portion,
the first portion is disposed in the semiconductor pattern, and
the second portion is disposed in the interlayer insulating film and extends toward the first portion,
a width of the first portion of the contact away from a boundary between the first portion of the contact and the second portion of the contact is less than a width of the second portion of the contact, at the boundary; and the filling conductive film is absent from the first portion of the contact.

17. The semiconductor device of claim 16, further comprising:
a silicide film extending along a profile of the contact between the contact and the semiconductor pattern,
wherein the first wire pattern comprises a lowermost wire pattern in the channel region; and
a lowermost part of the silicide film is located between an uppermost part of the first wire pattern and a lowermost part of the second wire pattern.

18. The semiconductor device of claim 16, wherein the second portion of the contact includes a contact recess defined by the barrier conductive film, and
the filling conductive film fills the contact recess.

* * * * *